US010334758B1

(12) United States Patent
Ramirez et al.

(10) Patent No.: US 10,334,758 B1
(45) Date of Patent: Jun. 25, 2019

(54) PROCESS FOR INCREMENTALLY COMMISSIONING MECHANICAL INFRASTRUCTURE IN A DATA CENTER

(71) Applicant: Amazon Technologies, Inc., Seattle, WA (US)

(72) Inventors: Antonio William Vasquez Ramirez, Snohomish, VA (US); Matthew Thomas Phillips, Bainbridge Island, WA (US); Faran Harold Kaplan, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 747 days.

(21) Appl. No.: 14/732,573

(22) Filed: Jun. 5, 2015

(51) Int. Cl.
*H05K 7/20* (2006.01)
*H05K 7/18* (2006.01)
(Continued)

(52) U.S. Cl.
CPC .......... *H05K 7/20709* (2013.01); *G06F 1/26* (2013.01); *H05K 7/18* (2013.01); *H05K 7/20718* (2013.01);
(Continued)

(58) Field of Classification Search
CPC .. H05K 7/18; H05K 7/20709; H05K 7/20718; H05K 7/20745; H05K 7/20754;
(Continued)

(56) References Cited

U.S. PATENT DOCUMENTS

2004/0244310 A1* 12/2004 Blumberg ................ H05K 7/18
52/79.1
2009/0031148 A1* 1/2009 Densham ................ G06F 1/206
713/300
(Continued)

FOREIGN PATENT DOCUMENTS

JP 2010218330 A * 9/2010

OTHER PUBLICATIONS

Michael Rosenberg, "Commissioning the Data Center the Intergrated Systems Test", Glenmount Global Solutions, 2012, pp. 1-19.
(Continued)

*Primary Examiner* — A. Dexter Tugbang
(74) *Attorney, Agent, or Firm* — Robert C. Kowert; Meyertons, Hood, Kivlin, Kowert & Goetzel, P.C.

(57) ABSTRACT

Data center mechanical infrastructure is incrementally deployed and commissioned to support incremental changes in computing capacity in a data center while mitigating interaction between infrastructure being commissioned and installed computer systems. Incremental mechanical infrastructure commissioning can be concurrent with incremental electrical infrastructure commissioning and includes operating mechanical infrastructure to remove heat generated as a result of operating electrical infrastructure to support simulated electrical loads as part of electrical infrastructure commissioning. Incremental mechanical infrastructure deployment can be based on the power support capacity provided by incrementally deployed electrical infrastructure. Incremental infrastructure deployment can include
(Continued)

partitioning a space in which incremental mechanical infrastructure is configured to provide cooling, so that heat generation and removal in the space, based on commissioning the incremental mechanical infrastructure, is isolated electrical and cooling support provided to electrical loads located in a remainder of the data center.

17 Claims, 7 Drawing Sheets

(51) Int. Cl.
    *G06F 1/26*         (2006.01)
    *G01R 31/02*       (2006.01)

(52) U.S. Cl.
    CPC ..... *H05K 7/20745* (2013.01); *H05K 7/20754* (2013.01); *H05K 7/20836* (2013.01); *H05K 7/20945* (2013.01); *G01R 31/021* (2013.01); *Y10T 29/4902* (2015.01); *Y10T 29/49004* (2015.01)

(58) Field of Classification Search
    CPC .. H05K 7/20836; H05K 7/20945; G06F 1/26; Y10T 29/49004; Y10T 29/4902; G01R 31/021
    See application file for complete search history.

(56) References Cited

U.S. PATENT DOCUMENTS

| | | | |
|---|---|---|---|
| 2011/0029152 A1* | 2/2011 | Patel | H05K 7/20836 700/300 |
| 2013/0111937 A1* | 5/2013 | Hendrix | H05K 7/20745 62/127 |

OTHER PUBLICATIONS

Paul Marcoux, "Data Center Projects: Commissioning", Schneider Electric, 2011, pp. 1-17.
U.S. Appl. No. 14/663,138, filed Mar. 19, 2015, Antonio William Vasquez Ramirez, et al.

* cited by examiner

PROCESS FOR INCREMENTALLY COMMISSIONING MECHANICAL INFRASTRUCTURE IN A DATA CENTER

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many computing racks, which may include server racks. Each computing rack, in turn, may include many computer systems, servers, associated computer equipment, etc.

Because the computer room of a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 208V). A network of cabling, bus bars, power connectors, and power distribution units, is used to deliver the power at the lower voltage to numerous specific components in the facility.

Computer systems typically include a number of components that generate waste heat. Such components include printed circuit boards, mass storage devices, power supplies, and processors. For example, some computers with multiple processors may generate 250 watts of waste heat. Some known computer systems include a plurality of such larger, multiple-processor computers that are configured into rack-mounted components, and then are subsequently positioned within a rack computer system. Some known rack computer systems include 40 such rack-mounted components and such rack computer systems will therefore generate as much as 10 kilowatts of waste heat. Moreover, some known data centers include a plurality of such rack computer systems.

Some known data centers include methods and apparatus that facilitate waste heat removal from rack systems. Such methods and apparatus can include one or more instances of mechanical infrastructure which removes heat from one or more rack computer systems, including one or more of an intake air moving device which induces air flow into a space, an exhaust air moving device which induces air flow out of a space, one or more air cooling systems which chill an air flow, etc. Active air cooling systems can include one or more of a mechanical cooling system, direct evaporation cooling system, coolant circulation cooling system, chilled water cooling system, etc.

In some cases, where some or all infrastructure initially installed in a data center is based on expected support requirements of server racks which are expected to be installed in the data center, the server racks which are actually installed in a data center may differ in support requirements from the server racks upon which the infrastructure for a data center is originally designed. In addition, the support requirements of installed server racks may vary from rack to rack. Infrastructure which is designed based on expected support requirements of installed server racks may be at least partially restricted in supporting server racks that are actually installed.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, electrical distribution infrastructure, and cooling infrastructure, etc., to support changes in computing capacity. Additional time and resources are typically needed to conduct inspections and obtain certifications and approvals, such as for electrical and HVAC systems. Changes in computing capacity may result in changes in infrastructure support required to support the changed computing capacity. Installing infrastructure equipment, modifying infrastructure equipment, etc. may be time consuming and expensive, if even feasible. For example, where an installed server rack in a portion of a data center is replaced with another server rack, where the new server rack has substantially greater infrastructure support requirements, modifying the infrastructure which supported the previously-installed server rack may be difficult, particularly where the infrastructure to be modified lacks sufficient excess capacity to provide the needed support to the newly-installed server rack.

Figure 1:
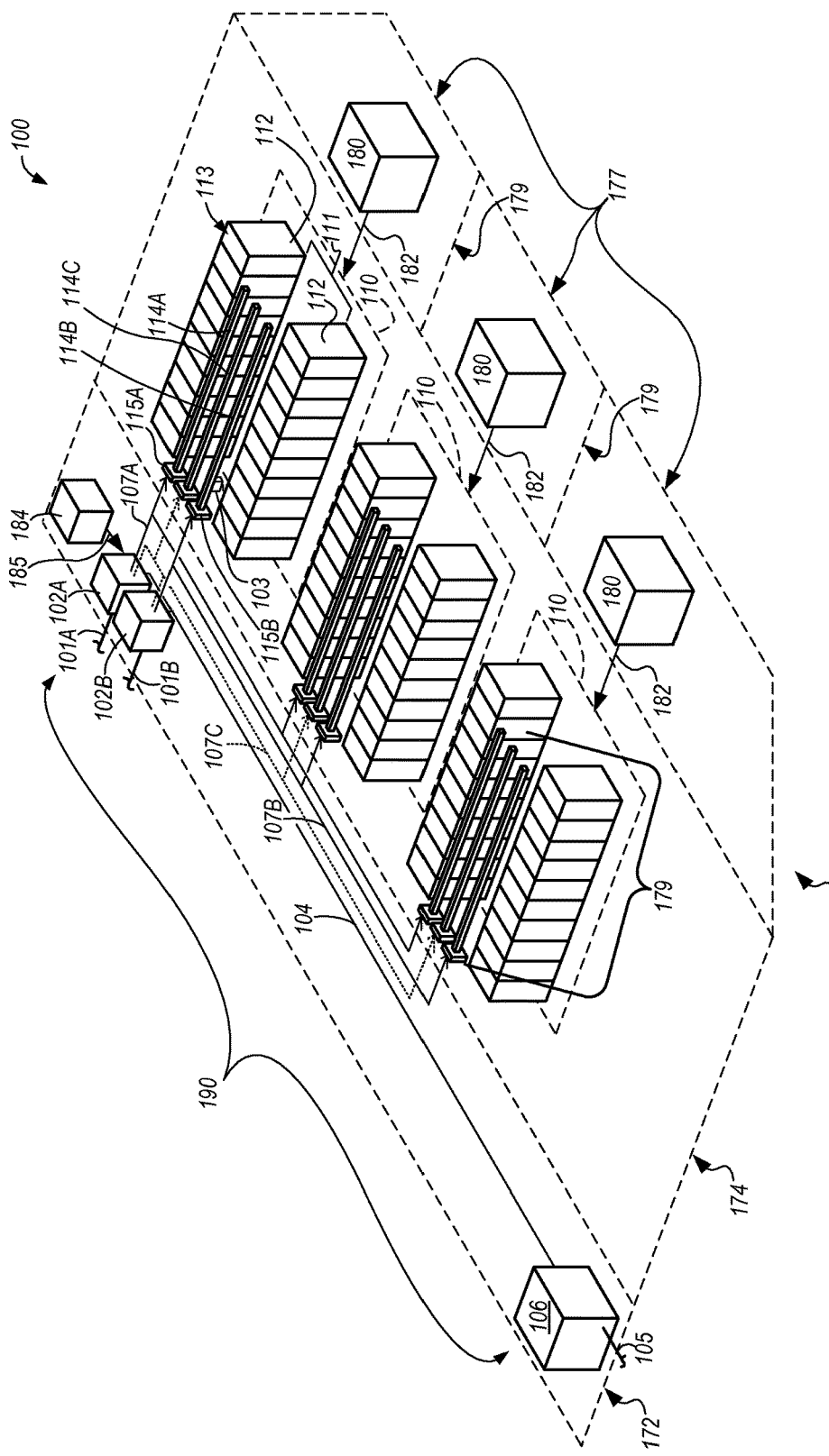
FIG. 1 is a schematic diagram illustrating a perspective view of a data center including a set of rack computer systems, electrical infrastructure configured to support electrical power consumption by the rack computer systems, and mechanical infrastructure configured to at least support cooling of the rack computer systems, according to some embodiments.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of deploying mechanical infrastructure in a data center are disclosed.

According to one embodiment, a method for incrementally commissioning mechanical infrastructure in a data center includes installing a power distribution system in the data center, where the power distribution system comprises a set of power distribution components configured to provide electrical power support to a plurality of rack computer systems in a plurality of computer spaces. The method further includes installing a set of power system mechanical infrastructure which is configured to provide cooling support to the power distribution system and verifying that the set of power system mechanical infrastructure is configured to support the power distribution system providing continuous power support to the plurality of rack computer systems. Such verification includes simulating electrical power consumption by the plurality of sets of rack computer systems, based on operation of a set of load banks electrically coupled to the power distribution system, such that the power distribution system generates heat as a result of supporting the simulated electrical power consumption; and providing cooling support to the power distribution system, via operation of the set of power system mechanical infrastructure, concurrently with the power distribution system supporting the simulated electrical power consumption, such that the set of power system mechanical infrastructure removes the heat generated by the power distribution system as a result of supporting the simulated electrical power consumption. The method further includes installing a set of electrical infrastructure in a particular computer space, of the plurality of computer spaces, such that the set of electrical infrastructure is configured to supply electrical power received from the power distribution infrastructure to electrical loads located in the particular computer space; installing a set of computer space mechanical infrastructure proximate to the particular computer space, wherein the set of computer space mechanical infrastructure is configured to support cooling of electrical loads located in the particular computer space and verifying that the set of electrical infrastructure is configured to support electrical power consumption by at least one set of rack computer systems in the particular computer space. Such verification that the set of electrical infrastructure is configured to support electrical power consumption by at least one set of rack computer systems in the particular computer space includes operating at least one load bank electrically coupled to the set of electrical infrastructure, such that electrical power support of electrical power consumption by the at least one set of rack computer systems through the set of electrical infrastructure is simulated in the particular computer space. The method further includes verifying that the set of computer space mechanical infrastructure is configured to support steady-state cooling of the particular computer space concurrently with electrical power consumption by the at least one set of rack computer systems in the particular computer space. Such verification that the set of computer space mechanical infrastructure is configured to support steady-state cooling of the particular computer space includes providing cooling support to the particular computer space, via operation of the set of computer space mechanical infrastructure concurrently with operating the at least one load bank electrically coupled to the set of electrical infrastructure, such that the set of computer space mechanical infrastructure removes the heat generated by the electrical infrastructure and the at least one load bank as a result of simulating electrical power consumption by the set of rack computer systems in the particular computer space.

According to one embodiment, a method includes verifying that mechanical infrastructure in a data center is configured to support cooling of at least an initial set of rack computer systems, of a plurality of sets of rack computer systems, in an initial computer space, of a plurality of computer spaces configured to accommodate separate sets of rack computer systems. Such verification includes simulating electrical power consumption, by the plurality of sets of rack computer systems, of electrical power supplied by a power distribution system installed in the data center in an absence of electrical power distribution infrastructure in an entirety of the plurality of computer spaces, such that the power distribution system generates heat as a result of supporting the simulated electrical power consumption by the plurality of sets of rack computer systems; and operating a set of power system mechanical infrastructure equipment, installed proximate to the power distribution system and collectively configured to remote heat generated by the power distribution system, such that, concurrently with the power distribution system supporting the simulated electrical power consumption, each power distribution component of the power distribution system remains at an operating temperature which is less than a corresponding threshold operating temperature of the respective power distribution component.

According to one embodiment, a method includes verifying that mechanical infrastructure in a data center is configured to support cooling of a set of rack computer systems, of a plurality of sets of rack computer systems, in an individual computer space, of a plurality of computer spaces configured to accommodate separate sets of rack computer systems. Such verification includes simulating electrical power consumption by the set of rack computer systems in the individual computer space, based on supplying electrical power through power distribution infrastructure in the individual computer space to a load bank located in the individual computer space, such that the power distribution infrastructure and the load bank collectively generate, in the individual computer space, a quantity of heat associated with the simulated electrical power consumption by the set of rack computer systems; and operating a set of computer space mechanical equipment, independently of separate sets of computer space mechanical equipment which remove heat from separate sets of rack computer systems in a remainder of computer spaces, of the plurality of computer spaces, such that the set of computer space mechanical equipment maintain operating temperatures within the individual computer space beneath a particular set of threshold temperatures, concurrently with simulating electrical power consumption by the set of rack computer systems in the individual computer space.

As used herein, "air handling system" means a system that provides or moves air to, or removes air from, one or more systems or components. An air handling system can include one or more air moving devices.

As used herein, "air moving device" includes any device, element, system, or combination thereof that can move air. Examples of air moving devices include fans, blowers, and compressed air systems.

As used herein, "computer room" means a room of a building in which computer systems, such as rack-mounted servers, are operated.

As used herein, "computing" includes any operations that can be performed by a computer, such as computation, data storage, data retrieval, or communications.

As used herein, "data center" includes any facility or portion of a facility in which computer operations are carried out. A data center may include servers dedicated to specific functions or serving multiple functions. Examples of computer operations include information processing, communications, simulations, and operational control.

As used herein, "active cooling", "active chilling", etc. refers to cooling of air by a process which involves transferring heat from the air to one or more other fluids which are separate from the air. Such other fluids can include water, various coolants, refrigerants, some combination thereof, etc. Active cooling systems can include heat exchangers which remove heat from the one or more other fluids. An example of an active cooling system can include a cooling system which includes circulating air through a data center module to remove heat from heat producing components therein, and circulating a separate fluid through one or more pathways in the data center module, including pipes, coils, heat exchangers, etc. to cool the circulating air before the air removes heat from such components, after the air removes heat from such components, concurrently with the air removing heat from such components, some combination thereof, etc. Another example of an active cooling system includes chilled water cooling systems. An example of active cooling includes cooling air by a process which includes mechanical cooling. An example of active cooling includes cooling air by a process which includes evaporative cooling.

As used herein, "mechanical cooling" means cooling of air by a process that involves doing mechanical work on at least one fluid, such as occurs in vapor-compression refrigeration systems. Mechanical cooling may include sensible cooling.

As used hereinafter, the terms "cool" and "chill", and variations thereof, are used interchangeably.

As used herein, "sensible cooling" refers to cooling of air where sensible heat of the air is removed to as to reduce the dry bulb temperature of the air without appreciable change in the moisture content of the air. For example, during a sensible cooling process the dry bulb temperature and wet bulb temperature of the air may be reduced, while the latent heat and dew point temperature of the air may not appreciably change.

As used herein, "evaporative cooling" refers to cooling of air by evaporation of liquid. Evaporative cooling may include adiabatic cooling of the air, whereby the dry bulb temperature of the air is reduced without appreciable change in the enthalpy of the air. Adiabatic cooling may include reducing the dry bulb temperature of the air without appreciable change of the wet bulb temperature of the air.

As used herein, "direct evaporative cooling" means cooling of air by evaporation of liquid directly into a stream of air to be cooled.

As used herein, "evaporative cooling system" means a system that cools by evaporation of a liquid.

As used herein, "ambient" refers to a condition of outside air at the location of a system or data center. An ambient temperature may be taken, for example, at or near an intake hood of an air handling system.

As used herein, a "chiller-less air cooling system" refers to an air cooling system that provides cooling air independent of internal mechanical cooling systems. Some chiller-less air cooling systems include an evaporative cooling system. Some chiller-less air cooling systems, in some embodiments, operate in a free-cooling mode without internal evaporative cooling systems or mechanical cooling systems.

As used herein, a "free cooling mode" includes a mode of operation in which an air handling system pulls air at least partially from an external source (such as air outside a facility) and forces the air to electronic equipment without active chilling in the air-handling system (e.g., fluid flow through the chiller coils in the air handling sub-system is shut off by closing a flow control valve).

As used herein, "room" means a room or a space of a building. A "computer room" means a room in which computer systems, such as rack-mounted servers, are operated.

As used herein, providing power "support" refers to providing one or more power feeds to be available to one or more downstream systems and components, including one or more electrical loads. Such provided power feeds may be precluded from being received by the systems and components but may be made available for receipt based at least in part upon a positioning of one or more components upstream of the systems and components. For example, a secondary power distribution system may provide secondary power support to an electrical load by providing a secondary power feed that can be selectively routed to the load by a switching device that is downstream of the secondary power distribution system and upstream of the load, where the switching device may selectively route the secondary power feed or a primary power feed to the load based at least in part upon one or more conditions associated with the primary power feed. Where a power distribution system, one or more power distribution components, etc. are configured to support a certain maximum amount of electrical power consumption, the maximum amount of electrical power consumption is referred to herein as the power support capacity of the power distribution system, one or more power distribution components, etc.

As used herein, "electrical load" includes a device, component, etc. which consumes electrical power. Where a device consumes electrical power to perform one or more functions, including performing computing operations, the device is referred to herein as a "live load". Where a device generates an amount of electrical power consumption which corresponds to electrical power consumption by one or more live loads, the device is referred to herein as a "test load". Where a power distribution system supplies electrical power which is consumed by one or more live loads, test loads, some combination thereof, etc., the power distribution system is referred to as "supporting", or "providing electrical power support to", the one or more live loads, test loads, some combination thereof, etc. The electrical power consumption, by an electrical load, can itself be referred to as a load.

As used herein, "power distribution unit", also referred to herein as a "PDU", means any device, module, component, or combination thereof, which can be used to distribute electrical power. The elements of a power distribution unit may be embodied within a single component or assembly (such as a transformer and a rack power distribution unit housed in a common enclosure), or may be distributed among two or more components or assemblies (such as a transformer and a rack power distribution unit each housed in separate enclosure, and associated cables, etc.).

As used herein, "primary power" means any power that can be supplied to an electrical load, for example, during normal operating conditions. A power distribution system (also referred to herein as a "power system") that distributes primary power may be referred to as a primary power system.

As used herein, "secondary power", which can include one or more of "reserve power", "backup power", etc., means power that can be supplied to an electrical load upon the failure of, or as a substitute for, primary power to the load. A power distribution system (also referred to herein as a "power system") that distributes secondary power may be referred to as a secondary power system.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc—read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, a "damper" includes any device or component that can be moved to control (e.g., increase or decrease) the flow of fluid through a duct or other passageway. Examples of dampers include plates, blades, panels, or discs, or any combination thereof. A damper may include multiple elements. For example, a damper may include a series of plates in parallel relation to one another that can be simultaneously rotated to close a duct. As used herein, to "position" a damper means to place or leave one or more elements of the damper to achieve desired flow characteristics through the damper, such as open, closed, or partially open. In a system with eighteen air handling sub-systems, positioning the outside air dampers may include opening outside air dampers in eight of the sub-systems and keeping outside air dampers closed in the other ten sub-systems.

As used herein, a "module" is a component or a combination of components physically coupled to one another. A module may include functional elements and systems, such as computer systems, circuit boards, racks, blowers, ducts, and power distribution units, as well as structural elements, such a base, frame, housing, or container.

As used herein, a "rack computer system" means a computer system that includes one or more computing devices mounted in a rack.

FIG. 1 is a schematic diagram illustrating a perspective view of a data center including a set of rack computer systems, electrical infrastructure configured to support electrical power consumption by the rack computer systems, and mechanical infrastructure configured to at least support cooling of the rack computer systems, according to some embodiments.

Data center 100 includes separate spaces 172, 174, 176 which are each associated with separate elements of providing and supporting computing capacity in the data center 100. For example, as shown, space 172 is associated with electrical power support capacity and includes a space in which at least some electrical infrastructure, which includes power distribution systems 102A-B and 106 and at least some of power distribution infrastructure 104, 107A-C, are located. In addition, space 174 is associated with providing computing capacity and includes a space in which computer spaces 110 which include separate sets 112 of rack computer systems 113 are located. In addition, space 176 is associated with computer space mechanical support capacity and includes a space in which various sets of mechanical infrastructure 180 are located. In some embodiments, some or all of one or more of spaces 172, 174, 176 are located within separate rooms which are separated by one or more partitioning structures, including one or more of walls, doors, etc. In some embodiments, some or all of one or more of spaces 172, 174, 176 are located within a common enclosure.

Data center 100 includes a computer room 174 which includes multiple computer spaces 110, also referred to herein as "spaces", which each provide computing capacity for the data center 100. In some embodiments, each separate space 110 is a separate computer room within computer room 174, where room 174 includes a single enclosure of rooms 110. Each space 110 includes an aisle 111 and two rows 112 of rack computer systems 113, also referred to herein as "sets" 112 of rack computer systems 112, which extend along the length of the aisle 111 along opposite side ends of the aisle 111. Each rack computer system 113 can provide at least a portion of computing capacity of the space 110 by performing computing operations. In the illustrated embodiment, each space 110 in room 174 of data center 100 is oriented in parallel, such that the respective aisles 111 of each of the spaces 110 extend in parallel with each other along their respective lengths between opposite ends of the aisles 111. Furthermore, the rows 112 of rack computer systems 113 in the parallel spaces 110 extend in parallel with each other.

Data center 100 includes electrical infrastructure 190 which provides electrical power support to the various rack computer systems 113 in the data center 100. Electrical infrastructure 190 includes primary power distribution systems 102A-B and secondary power distribution system 106. Each power distribution system 102A-B, 106 can include various separate sets of power distribution components, including a utility transformer, generator, uninterruptible power supply ("UPS"), power distribution unit ("PDU"), power distribution panel board (PDP), utility distribution board, critical distribution board, etc. Each separate power distribution system receives utility power from a separate utility power source and is configured to provide electrical power support to one or more sets of rack computer systems in the data center 100, via one or more instances of power distribution infrastructure. In the illustrated embodiment of FIG. 1, power distribution infrastructure includes power transmission lines 104, 107A-C, power busways 114A-C, feed boxes 115A-C, tap boxes 103, etc. and comprises one or more sets of equipment, referred to herein as sets of power distribution infrastructure, which are each configured to distribute power provided by one or more power distribution systems to one or more sets of rack computer systems 113 located in one or more corresponding particular spaces 110.

Each space 110 in data center 100 includes a set 179 of power distribution infrastructure configured to supply electrical power, received from one or more power distribution systems 102, 106, to one or more sets 112 of rack computer systems 113 located in the respective space 110, thereby providing electrical power support to the sets 112 of rack computer systems 113 and at least partially supporting computing operations performed by the sets 112 of rack computer systems 113.

Each set 179 of power distribution infrastructure includes a set of power busways 114 which can provide electrical power support to rack computer systems 113 in the space. A set of power busways 114 can include separate power busways which receive power from separate power distribution systems and are electrically coupled to one or more components in the space, so that the busways can distribute power to one or more rack computer systems 113 via the coupled components. In the illustrated embodiment, for example, space 110 includes power busways 114A-B. The busways 114 extend through the space 110, along the length of the aisle 111 between opposite ends of the aisle 111. Each busway 114A-B includes at least one feed box 115A-B which receives power which is carried by the respective busway and distributed to electrically coupled components in the space 110 to provide power support to at least some of the rack computer systems 113 in the space.

In some embodiments, separate portions of rack computer systems in one or more spaces receive primary power support from separate busways which receive power from separate primary power distribution systems. For example, in the illustrated embodiment, each space 110 includes power busways 114A and 114B which extend along the aisle 111 of the space 110 and respectively receive primary power from a separate primary power distribution system 102A-B. In some embodiments, busway 114A is electrically coupled to one of the rows 112 of rack computer systems 113 on one side end of aisle 111, and busway 114B is electrically coupled to another row 112 of rack computer systems 113 on the other side end of aisle 111. In some embodiments, a single primary power busway 114 extends through an aisle 111 and provides primary power support to each of the rack computer systems 113 in the space 110 by electrically coupling with each of the rack computer systems 113. Each of the primary power busways 114A-B includes a separate feed box 115A-B at one end of the respective primary power busway. The respective feed boxes 115A-B are each electrically coupled to a separate primary power system 102A-B via respective separate power transmission lines 107A-B.

The feed boxes 115A-B may be located at a particular end of each of the primary power busways 114A-B that is proximate to a particular end of aisle 111. In the illustrated embodiment, for example, feed boxes 115A-B are located at respective ends of busways 114A-B which are proximate to an end of aisle 111 which is proximate to primary power systems 102A-B. In some embodiments, one or more of the feedboxes is coupled to a busway disconnect switch which is configured to selectively electrically couple or isolate a corresponding power busway relative to a respective power transmission line 107 instance.

Primary power distribution systems 102A-B each receive utility power from separate power sources 101A-B, respectively. Each primary power distribution system 102A-B can distribute primary power to various rack computer systems 113 in the spaces 110 via power transmission lines 107A-B, respectively. Each primary power system can include various separate sets of power distribution components, including a utility transformer, generator, UPS, power distribution unit (PDU), etc.

The separate instances of power transmission lines 107A-B can each at least partially comprise one or more busways, bus ducts, power cables, etc. In some embodiments, the separate power transmission lines 107A-C are independent of the separate sets 179 of power distribution infrastructure in separate spaces 110, where the power transmission lines 107 comprise power distribution infrastructure associated with one or more corresponding power distribution systems 102, 106 and can be referred to herein as being included within the one or more power distribution systems. For example, power transmission lines 107A, being coupled to power distribution system 102A, can be referred to herein as being included in power transmission system, where the lines 107A comprise a downstream end of the power distribution system 102A to which multiple sets of power distribution infrastructure can be electrically coupled in parallel.

Secondary power distribution system 106 receives power from a separate power source 105 and is electrically coupled to at least one power distribution component included in the primary power distribution systems 102A-B via one or more instances of power transmission lines 104. For example, the secondary power distribution system 106 can be electrically coupled to power distribution panelboards included in each of the systems 102A-B, where each panelboard included in a particular primary power distribution system 102 is configured to selectively switch the power distributed to the instance 107 of power transmission lines which are coupled with a set of power busways 114 between one of primary power, distributed from a set of primary power distribution components included in the system 102 which are upstream of the panelboard, or secondary power distributed from the secondary power distribution system 106 via the instances of power transmission lines 104.

In some embodiments, including the illustrated embodiment of FIG. 1, the secondary power distribution system 106 distributes secondary power to one or more power distribution panelboards, and primary and secondary power is distributed from the one or more power distribution panelboards to one or more separate power busways 114A-C in the various spaces 110 via separate lines 107A-C. A power distribution panelboard, in some embodiments, is included in one or more primary power distribution systems 102A-B. In the illustrated embodiment of FIG. 1, secondary power distribution system 106 is coupled, via instances of power transmission lines 104, to power distribution panelboards included in primary power distribution systems 102A-B, and where secondary power from the system 106 can be distributed from the power distribution panelboards in systems 102A-B to secondary power busways 114C, in each space 110, which carry secondary power from the system 106 independently of primary power distributed from the primary power distribution systems 102A-B which distribute power to separate primary power busways 114A-B via separate instances of power transmission lines 107A-B. Where a switching assembly, including an ATS, is included in a space 110 and is configured to selectively distribute power to racks 113 in the space 110 from a separate one of secondary power distribution system 106 or a primary power distribution system 102A-B, the switching assembly can be electrically coupled to each of a secondary power busway 114C in the space 110 and at least one of the primary power busways 114A-B in the space, so that the switching assembly can selectively distribute power received from one of the secondary power busway 114C or a primary power busway 114A-B.

In some embodiments, a power distribution panelboard is separate from primary power distribution systems 102A-B, such that the various power systems 102A-B, 106 distribute power to one or more power distribution panelboards which are separate from the power distribution systems. For example, in the illustrated embodiment, elements 102A-B can be power distribution panelboards which each receive secondary power from system 106 via lines 104 and each receive primary power from a separate primary power distribution system via separate power transmission lines 101A-B, and where primary power is distributed from the panelboards via separate primary power transmission liens 107A-B and secondary power is distributed from one or more of the panelboards via one or more secondary power transmission lines 107C.

In some embodiments, the secondary power distribution system 106 is directly electrically coupled to secondary power busways 114C via one or more instances of power transmission lines 107C, independently of any power transmission lines 104 electrically coupling the secondary power distribution system 106 to one or more components of the primary power distribution systems 102A-B. Where system 106 is electrically coupled to the secondary power busways 114C in each space 110 via one or more instances of power transmission lines 107C, the one or more instances of power transmission lines 107C can comprise one or more busways, bus ducts, power cables, some combination thereof, etc.

In some embodiments, the electrical infrastructure 190 is installed incrementally in data center 100. The incremental installation can correspond with incremental installation of rack computer systems 113 in the various spaces 110 of data center 100, so that installation of various equipment in the electrical infrastructure 190, where such equipment can be referred to as electrical infrastructure components, is postponed until such equipment is required to be installed to support electrical power consumption by one or more rack computer systems 113 in the data center. As a result, capital expenditure on electrical infrastructure components is postponed until required, thereby mitigating resource waste which can result from installing components before they is needed such that the installed components remain installed but unused for a period of time.

For example, where data center 100 is initially constructed, and the number of rack computer systems 113 to be initially installed can be installed in a single space 110, a primary power distribution system 102, instance of power transmission lines 107, and a set 179 which includes at least one busway 114 in space 110 can be installed, so that electrical power support can be provided to the rack computer systems 113 installed in the space 110. A secondary power distribution system 106, as well as additional primary power distribution systems 102, power transmission lines 107, 104, and busways 114 can be installed concurrently. As the computing capacity requirement for the data center 100 increases over time, additional rack computer systems 113 can be installed in the initial space 110 to provide additional computing capacity until the available space in which the rack computer systems 113 can be installed in the initial space 110 is exhausted, at which point at least one additional busway 114 is installed in another space 110, and the additional busway 114 coupled to a primary power distribution system 102 via one or more instances of power transmission lines 107, so that rack computer systems 113 can be installed in the another space 110 and receive electrical power support from the additional busway 114.

Data center 100 includes one or more sets of mechanical infrastructure which provide one or more forms of infrastructure support to various equipment, components, etc. in the data center to support computing operations by one or more sets of rack computer systems in the data center. In some embodiments, one or more sets of mechanical infrastructure, which includes one or more sets of mechanical infrastructure equipment, is configured to provide cooling support to one or more spaces of a data center, thereby providing cooling support to one or more instances of infrastructure, equipment, rack computer systems, etc. located in the one or more spaces.

In some embodiments, a set of mechanical infrastructure which is configured to provide cooling support to a particular portion of a data center includes a set of mechanical infrastructure equipment which is configured to provide cooling support to one or more particular sets of rack computer systems, electrical infrastructure, etc. In the illustrated embodiment, for example, data center 100 includes a set of power system mechanical infrastructure 184, which can include one or more sets of mechanical infrastructure equipment, which provides cooling support 185 to one or more of the power distribution systems 102A-B. In addition, data center 100 includes multiple separate sets of computer space mechanical infrastructure 180, which can include one or more sets of mechanical infrastructure equipment, which each provides cooling support 182 to sets 112 of rack computer systems 113, sets 179 of computer space power distribution infrastructure, some combination thereof, etc. located in separate spaces 110.

In some embodiments, a set 180, 184 of mechanical infrastructure includes one or more instances of equipment configured to provide a stream of intake air to one or more sets of rack computer systems, infrastructure, etc., so that the stream of intake air removes heat generated by the one or more sets of rack computer systems, infrastructure, etc. For example, a given set of mechanical infrastructure can include one or more air handling units, intake air moving devices, etc. configured to provide a flow of intake air into a space. In some embodiments, the given set of mechanical infrastructure includes one or more air cooling devices configured to chill one or more streams of intake air. Air cooling devices which can be included in a set of mechanical infrastructure can include one or more of an active cooling unit, a free-cooling unit, a sensible cooling unit, a mechanical cooling unit, a chilled water cooling unit, a direct-evaporation cooling unit, etc.

In some embodiments, a set 180, 184 of mechanical infrastructure includes one or more instances of equipment configured to remove a stream of exhaust air from one or more sets of rack computer systems, infrastructure, etc., so that the stream of exhaust air removes heat generated by the one or more sets of rack computer systems, infrastructure, etc. from the space in which the one or more sets of rack computer systems, infrastructure, etc. is located. For example, a set of mechanical infrastructure can include one or more sets of exhaust air moving devices, adjustable air flow control dampers, etc.

Providing cooling support to a set of rack computer systems, infrastructure, etc. can include providing a flow of cooling air into a space in which the set of rack computer systems, infrastructure, etc. is located, where the flow of cooling air removes heat generated by the set of rack computer systems, infrastructure, etc. Providing cooling support to a set of rack computer systems, infrastructure, etc. can include removing a flow of exhaust air from a space in which the set of rack computer systems, infrastructure, etc. is located, where the flow of exhaust air comprises a flow of cooling air which has removed heat generated by the set of rack computer systems, infrastructure, etc.

In some embodiments, a set of mechanical infrastructure is configured to provide a range of cooling, which can be quantified in thermal units, thermal units over time, etc., to modules, rack computer systems, infrastructure, etc. located in a space. The maximum amount of cooling which can be provided by a set of mechanical infrastructure can be referred to as the cooling support capacity of the set of mechanical infrastructure.

In some embodiments, one or more sets of mechanical infrastructure are located in one or more particular portions of the data center 100. In some embodiments, a set of mechanical infrastructure which is configured to provide cooling support to a particular set of rack computer systems, infrastructure, etc. in a particular space is installed proximate to the space which includes the particular set of rack computer systems, infrastructure, etc. For example, as shown, the set of power system mechanical infrastructure 184 which provides cooling support 185 to power distribution systems 102A-B is installed in the space 172 in which the power distribution systems 102A-B are installed, and the sets of computer space mechanical infrastructure 180 which each provide cooling support 182 to one or more particular spaces 110 are installed proximate to the respective spaces 110.

As shown in FIG. 1, data center 100 includes a space 176 in which the separate sets of computer space mechanical infrastructure 180 are installed. As shown, separate sets of computer space mechanical infrastructure 180 installed in space 176 can be installed in separate areas 177 of space 176, where separate sets 180 configured to provide cooling support to separate spaces 110 are installed in corresponding areas 177 which are proximate to the respective spaces 110. As shown, in some embodiments, the separate areas 177 are partitioned via separate partitions 179.

In some embodiments, multiple sets of mechanical infrastructure are configured to provide cooling support to a space in which multiple computer spaces are located, so that the multiple sets of mechanical infrastructure are configured to collectively provide cooling support to the sets of rack computer systems installed in the multiple computer spaces. For example, in the illustrated embodiment of FIG. 1, where the multiple spaces 110 comprise open, un-partitioned spaces 110 within a single enclosure space 174, the multiple sets 180 of mechanical infrastructure can be configured to collectively provide cooling support to the sets of rack computer systems 113, power distribution infrastructure, etc. located in the multiple spaces 110 in space 174.

In some embodiments, mechanical infrastructure in a data center 100 is installed incrementally in data center 100. The incremental installation can correspond with incremental installation of one or more sets of rack computer systems 113, sets of electrical infrastructure, etc. in the various spaces 174, 172, 110 of data center 100, so that installation of various sets of mechanical infrastructure is postponed until such infrastructure is required to be installed to provide cooling support to one or more sets 112 of rack computer systems 113, electrical infrastructure, etc. in the data center. As a result, capital expenditure on mechanical infrastructure is postponed until required, thereby mitigating resource waste which can result from installing infrastructure before it is needed such that the installed infrastructure remains installed but unused for a period of time.

Incremental mechanical infrastructure installation can correspond with incremental installation of electrical infrastructure, including one or more sets of power distribution infrastructure, to support incremental installation of one or more sets of rack computer systems. In some embodiments, one or more sets of mechanical infrastructure are installed based on the cooling capacity provided by the one or more sets of mechanical infrastructure.

For example, a particular amount of computing capacity provided by a set of rack computer systems can be associated with a particular amount of heat generated by the set of rack computer systems, and a particular amount of electrical power provided by one or more power distribution systems, sets of power distribution infrastructure, etc. can be associated with a particular amount of heat. A set of mechanical infrastructure which is associated with a particular cooling support capacity can be installed in a data center based on a determination that one or more sets of electrical infrastructure, including one or more power distribution systems, sets of power distribution infrastructure, etc. are installed in the data center to provide a particular amount of electrical power support to rack computer systems in the data center, a determination that the particular amount of electrical power support is associated with generation of a particular amount of heat in the data center, and a determination that the set of mechanical infrastructure is configured to provide an amount of cooling support which at least removes the particular amount of generated heat.

In some embodiments, a set of mechanical infrastructure is installed in the data center based on a determination that the cooling support capacity of presently-installed sets of mechanical infrastructure, also referred to herein as deployed sets of mechanical infrastructure, is insufficient to remove the amount of heat generation which is associated with the power support capacity of incrementally installed electrical infrastructure and a further determination that the set of mechanical infrastructure is associated with a cooling support capacity which is sufficient to make up the heat removal shortfall of the deployed sets of mechanical infrastructure. In some embodiments, a set of mechanical infrastructure is selected and installed in the data center based on a determination that the cooling support capacity of the set of mechanical infrastructure is the smallest amount of cooling support which makes up the cooling support shortfall of the deployed sets of mechanical infrastructure.

Where data center 100 is initially constructed, and the number of rack computer systems 113 to be initially installed can be installed in a single space 110, a primary power distribution system 102, instance of power transmission lines 107, and a set 179 of power distribution infrastructure which comprises at least a single busway 114 in space 110 can be installed, so that electrical power support can be provided to the rack computer systems 113 installed in the space 110. A set of power system mechanical infrastructure 184 can be installed, concurrently with installation of power distribution systems 102A-B, to provide cooling support to the systems 102A-B, and a set of computer space mechanical infrastructure 180 can be installed, concurrently with installation of the set 179 of power distribution infrastructure in the space 110, to provide cooling support to the infrastructure set 179 and rack computer systems 113 which can be installed in the space 110.

As the computing capacity requirement for the data center 100 increases over time, additional rack computer systems 113 can be installed in the initial space 110 to provide additional computing capacity until the available space in which the rack computer systems 113 can be installed in the initial space 110 is exhausted, at which point at least one additional busway 114 is installed in another space 110, and the additional busway 114 coupled to a primary power distribution system 102 via one or more instances of power transmission lines 107, so that rack computer systems 113 can be installed in the another space 110 and receive electrical power support from the additional busway 114. In addition, sets of mechanical infrastructure 180 can be incrementally installed concurrently with incremental installation of separate sets of power distribution infrastructure so that the incremental expansion in cooling support to one or more spaces 110 corresponds to incremental expansion of computing capacity and electrical infrastructure to support the incrementally expanded computing capacity.

In some embodiments, one or more busways 114 is comprised of a series of busway segments which are coupled in series. One of the busway segments comprising a power busway 114 can include a busway stub segment which is coupled to one or more power transmission lines 107A-B. The busway stub segment can be installed as part of installation of one or more primary power distribution systems 102A-B in the data center 100, where the busway stub segment provides a placeholder location in a given space 110, at which additional busway segments can be coupled to the primary power distribution segment, via serially coupling with the busway stub segment, to establish a power busway.

Figure 2:
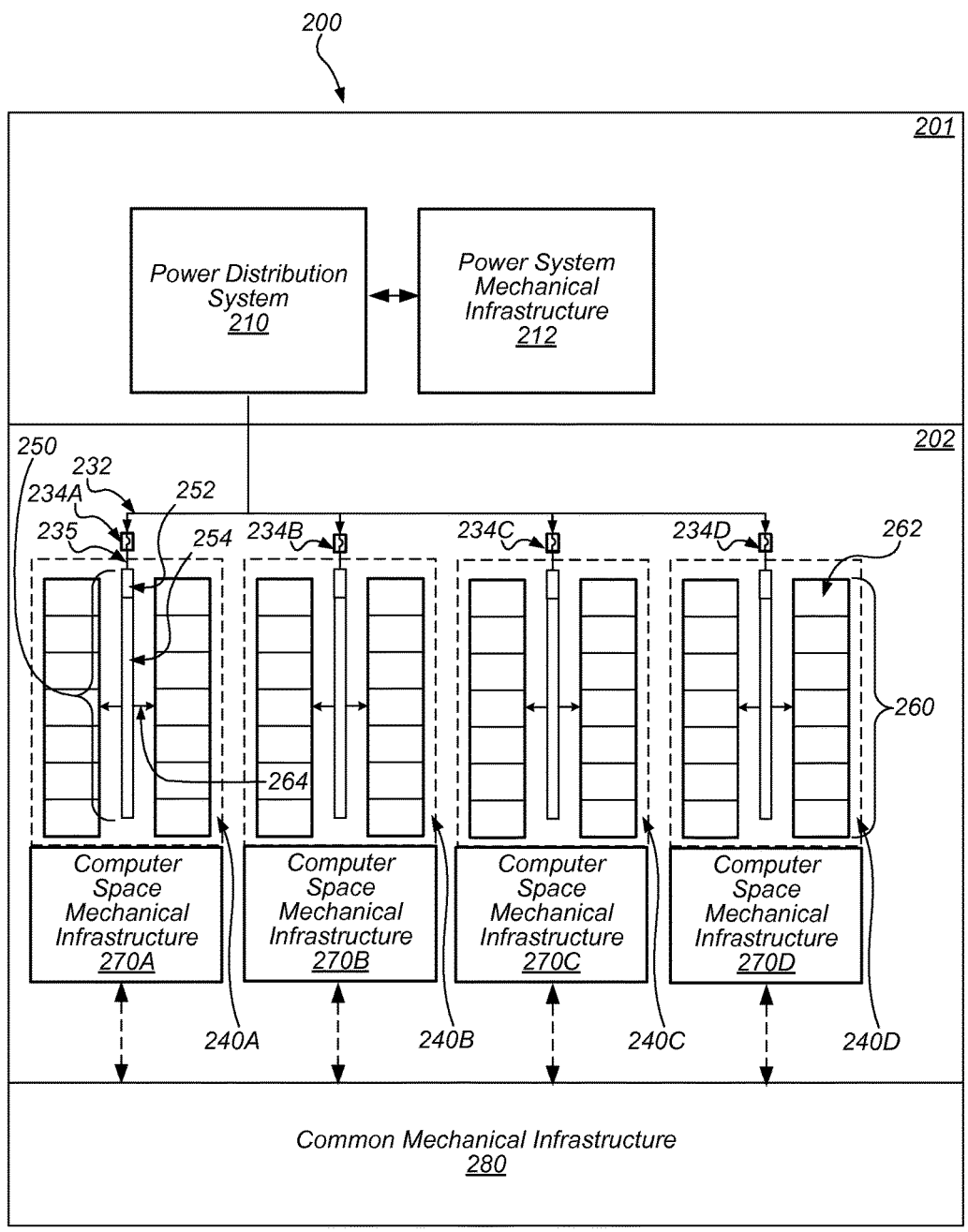
FIG. 2 is a schematic diagram illustrating a data center including multiple sets of electrical and mechanical infrastructure configured to provide electrical power support and cooling support to rack computer systems in various computer spaces, according to some embodiments.

FIG. 2 is a schematic diagram illustrating a data center including multiple sets of electrical and mechanical infrastructure configured to provide electrical power support and cooling support to rack computer systems in various computer spaces, according to some embodiments. The data center 200 can include the data center 100 shown in FIG. 1. The mechanical infrastructure 212, 270A-D, 280 illustrated in FIG. 2 can be included in any of the embodiments of data centers included herein, including the data center 100 shown in FIG. 1.

Data center 200 includes multiple separate spaces 201-202 in which separate components, also referred to herein as instances of hardware, instances of equipment, etc. are installed. For example, space 201 includes one or more power distribution systems 210 which are configured to provide electrical power support to one or more sets 260 of electrical loads 262 included in space 202 of a data center 200. A power distribution system 210 can include a transformer, which receives and steps down utility power received from a utility power feed, a generator which can provide back-up power, a switchgear which can selectively switch between distributing power from either the transformer or the generator, one or more uninterruptible power supplies (UPS) which can receive power distributed by the switchgear and can provide an uninterruptible supply of electrical power, and a power distribution panelboard which distributes electrical power from the primary power distribution system. It will be understood that a power distribution system can include additional components, different components, etc., including a critical distribution board, a utility switchboard, etc.

In addition, data center 200 includes a set of power system mechanical infrastructure 212 which is configured to provide cooling support to the power distribution system. To provide such cooling support, the infrastructure 212 can be configured to be installed proximate to system 210 and induce one or more cooling air streams which remove heat from one or more heat generating components included in the system 210. In some embodiments, to be configured to provide cooling support to system 210, the infrastructure 212 can be configured to remove sufficient heat from heat generating components of system 210, when system 210 is supplying an amount of electrical power which supports the plurality of rack computer systems 262 in each of the spaces 240A-D of data center 200, to cause the operating temperatures of each of the components included in the power distribution system 210 to remain below associated high-temperature thresholds.

As shown, electrical power distributed from a power distribution system 210 is distributed, in parallel via one or more instances 232 of power transmission lines, to separate sets of power distribution infrastructure 250A-D via busway disconnect switches 234A-D, where each set 250 includes a power busway 254, is located in a separate space 240A-D, and is coupled, via one or more instances 264 of power transmission lines, to one or more sets 260 of electrical loads 262 which are located in the same space 240 as the respective busway 254. As a result, electrical power distributed from a primary power distribution system 210 can be distributed, in parallel, to multiple sets 260 of electrical loads 262 located in multiple separate spaces 240. In some embodiments, the electrical loads 262 include one or more rack computer systems, each set 260 comprises a row of rack computer systems, each space 240 comprises an aisle along which two rows 260 of rack computer systems 262 extend in parallel, where each space 240, and power distribution infrastructure 200, is located in a data center.

Each power busway included in a given set 250 includes multiple busway segments, including a busway stub segment 252 and at least one additional busway segment coupled to the busway stub segment 252 to establish the busway 254. A busway stub segment, of a given power busway, is located at a "proximate end" of the busway 250 and is coupled, via an instance 235 of power transmission lines, to a particular busway disconnect switch 234. A busway disconnect switch 234 can selectively electrically couple or isolate a given coupled transmission line 235 to a line 232, thereby selectively electrically coupling or isolating a given busway stub segment 252 coupled to the switch 234 via the given line 235, and thus the set of power distribution infrastructure 250 coupled to the given line 235, to the primary power distribution system 210.

In some embodiments, one or more power distribution systems 210 can include one or more additional power distribution components, including one or more utility switchboards which is configured to selectively distribute power from one or more of a transformer or generator power output, one or more critical distribution panel boards, etc.

Data center 200 includes separate sets 270A-D of mechanical infrastructure which are each configured to provide cooling support to electrical loads 262 included in separate corresponding spaces 240A-D. As shown each set of mechanical infrastructure 270 is installed proximate to the corresponding space 240 which includes the corresponding sets 260 of electrical loads to which the set of mechanical infrastructure is configured to provide cooling support. Each set of mechanical infrastructure 270 can be configured to provide a certain cooling support capacity which is associated with the amount of electrical power which the set of power distribution infrastructure 250 which can be installed in the corresponding space 240 is configured to supply. For example, where the set 250 in space 240A is configured to provide a particular amount of electrical power, the corresponding set 270A of mechanical infrastructure can be configured to provide at least an amount of cooling support which results in removing at least a certain amount of generated heat which is associated with the particular amount of electrical power provided by the set 250 in space 240A.

Data center 200 includes one or more sets of common mechanical infrastructure 280 which are configured to support operation of one or more sets of mechanical infrastructure 270, 212 included in the data center 200. In some embodiments, a set of common mechanical infrastructure provides one or more fluids which are utilized by one or more sets of mechanical infrastructure to provide cooling support. For example, set 280 can include an intake air header configured to provide intake air to the sets of mechanical infrastructure 270A-D. In another example, 280 can include a coolant circulation plant, which can include a water chiller plant, which is configured to circulate a coolant to and from sets 270 of mechanical infrastructure, remove heat from said coolant, some combination thereof, etc.

In some embodiments, common mechanical infrastructure 280 can include multiple sets of mechanical infrastructure which can be incrementally installed, so that infrastructure support, including cooling support, provided by the common mechanical infrastructure 280 to the various spaces 240 is incrementally expanded. Some mechanical infrastructure can include discrete instances of mechanical infrastructure which extend from the common mechanical infrastructure to separate rows and provide at least a portion of the mechanical support provided by the common mechanical infrastructure to a separate space.

In some embodiments, the separate instances of computer space mechanical infrastructure 270 illustrated in FIG. 2 can include separate instances of mechanical infrastructure which couple the common mechanical infrastructure to separate spaces and instances of mechanical infrastructure which comprise portions of the common mechanical infrastructure which, when installed, provide at least a portion of mechanical infrastructure support to each of the spaces 240 to which the common mechanical infrastructure is coupled. For example, each set of computer space mechanical infrastructure 270 included in FIG. 2 can include one or more instances of mechanical infrastructure, including one or more of an air duct, damper, etc., which directs a portion of cooling air supplied by the common mechanical infrastructure to a particular computer space and can further include one or more instances of mechanical infrastructure, including one or more air handing units, air cooling units, etc., which is installed as an incremental portion of the common mechanical infrastructure 280 and, in combination with any other installed mechanical infrastructure in common mechanical infrastructure 280, collectively supply cooling air which is directed by various installed mechanical infrastructure which connects the infrastructure 280 to various spaces 240, to the separate spaces 240 as separate streams of cooling air.

In some embodiments, the power distribution system 210, power distribution infrastructure 250, mechanical infrastructure 212, 280, 270, etc. is installed incrementally to support incremental installation of electrical loads 262 in the various spaces 240. For example, electrical loads 262 can be initially installed in space 240A and not spaces 240B-D, such that at least some of the infrastructure 250, 210, 232, 270, 212, 280 is not needed, initially, to support installed loads 262. For example, sets of power distribution infrastructure 250 in spaces 240B-D, and sets of computer space mechanical infrastructure 270B-D, may not be required to provide power support and cooling support to electrical loads 262 if electrical loads are not initially installed in spaces 240B-D. As a result, electrical and mechanical infrastructure can be initially installed with sufficient infrastructure components, equipment, etc. to support the installed loads without installing excess infrastructure which would be needed to support presently-uninstalled loads in other spaces. As additional loads 262 are installed in additional spaces 240, infrastructure needed to support the additional loads can be installed. As a result, capital expenditures associated with installing power distribution infrastructure can be deferred until needed to support installed loads, so that capital expenditure on infrastructure resources which may lie unused at a site can be mitigated.

In some embodiments, electrical and mechanical infrastructure equipment installed at a data center are commissioned, individually and collectively, to verify that the components and the installed infrastructure are configured to support operation of at least some loads which will be installed at the site.

For example, where an installed set of power distribution infrastructure in a power distribution infrastructure is configured to support 3000 KWa of electrical power consumption by installed loads, which can be referred to as the power support capacity of the power distribution infrastructure, commissioning the power distribution infrastructure can include verifying that the installed power distribution infrastructure components can actually support 3000 KWa of electrical power consumption. In another example, where a data center is configured to support a set of loads which collectively consume 5000 KWa of electrical power, referred to herein as a total electrical power consumption of the data center, commissioning a power distribution system installed at the data center can include verifying that the power distribution system can actually support the total electrical power consumption of the data center.

In addition, where an installed set of mechanical infrastructure is configured to remove at least 100 BTU/hr from a space, commissioning the set of mechanical infrastructure can include verifying that the set of mechanical infrastructure can actually remove at least 100 BTU/hr from the space.

Commissioning at least some of electrical infrastructure can include performing various tests on various portions of the electrical infrastructure, including testing some or all of an installed power distribution system, testing some or all of an installed set of power distribution infrastructure, etc. Such testing can include coupling the one or more components in the electrical infrastructure to one or more load banks, where a load bank can generate an amount of electrical power consumption which corresponds to electrical power consumption by one or more electrical loads which can be installed at the site. As a result, the load bank can serve as a test load which simulates the electrical power consumption by one or more live loads.

In addition, commissioning at least some of mechanical infrastructure can include performing various tests on various portions of the mechanical infrastructure, which can include operating one or more components of an installed set of mechanical infrastructure concurrently with testing various portions of the electrical infrastructure, such that the set of mechanical infrastructure is tested with regard to being able to remove heat generated as a result of testing the various portions of the electrical infrastructure. For example, where electrical infrastructure is tested via operating one or more test loads which simulates electrical consumption by live loads, heat can be generated by the test loads and the electrical infrastructure supporting the test loads, and one or more sets of mechanical infrastructure can be tested via operating the one or more sets of mechanical infrastructure to remove the generated heat. A mechanical infrastructure set can be commissioned based on determining that, as a result of operating the mechanical infrastructure concurrently with supporting test loads via one or more sets of electrical infrastructure, operating temperatures associated with one or more portions of the data center in which one or more of the electrical infrastructure, test loads, etc. are located remain below one or more high-temperature thresholds associated with one or more of the electrical infrastructure, electrical loads, etc.

In some embodiments, a data center is configured to support electrical power consumption and cooling of a certain amount of electrical loads. Such configuration can include the data center including an electrical infrastructure which is configured to provide an amount of electrical power support which at least meets an amount of electrical power consumption by the certain amount of electrical loads, and mechanical infrastructure which is configured to provide an amount of cooling which at least meets the amount of heat generated by the certain amount of electrical loads, which enables the loads to operate at a certain level. The amount of electrical power consumption can be referred to as the electrical power consumption requirements of the certain amount of electrical loads, where the electrical power support provided by the electrical infrastructure is required to at least meet the electrical power consumption requirements of the certain amount of electrical loads. The amount of heat generated by the loads can be referred to as the cooling requirements of the certain amount of electrical loads, where the cooling support provided by the mechanical infrastructure is required to at least meet the cooling requirements of the certain amount of electrical loads.

As referred to herein, electrical loads installed at the site can include live loads which are supported by the power distribution infrastructure. The total amount of electrical consumption requirements which the electrical infrastructure is configured to at least meet can be referred to herein as the total live load which can be installed in the site, which comprises the collective live loads generated by the amount of devices which can be installed at the site. Where the site includes multiple spaces in which one or more separate sets of devices can be installed, the total amount of electrical consumption which the power distribution infrastructure is configured to support in each space can be referred to as the maximum electrical power consumption of the space.

In some embodiments, incrementally installing mechanical infrastructure in a data center includes initially installing a certain initial set of minimum mechanical infrastructure which provides a minimum amount of cooling support to support operation of at least one live load. Such initial installation can include installing a set of power system mechanical infrastructure which is configured to provide cooling support to at least one power distribution system which is configured to provide power support to the at least one live load and installing a set of computer space mechanical infrastructure which is configured to provide cooling support to the at least one live load.

In some embodiments, where incrementally installing mechanical infrastructure includes initially installing a certain amount of minimum mechanical infrastructure to support at least one live load, the incrementally installing further comprises commissioning the initially installed mechanical infrastructure before installing live loads. Such commissioning can include commissioning initially-installed electrical infrastructure which provides a minimum amount of electrical power support to support the at least one live load and concurrently commissioning the initially-installed minimum mechanical infrastructure based on heat generated as a result of commissioning the initially-installed electrical infrastructure. Where the data center includes multiple spaces in which separate sets of live loads collectively generate a maximum electrical power consumption of the spaces in which the loads are installed, commissioning an initially-installed electrical infrastructure can include verifying that an installed power distribution system can support the maximum electrical power consumption of the plurality of spaces which the system is configured to support and verifying that an installed set of power distribution infrastructure included in a space is configured to support a quantity of electrical loads which can be installed in the space in which the installed set of power distribution infrastructure is located.

In some embodiments, an initially-installed power distribution system is configured to support live loads in multiple separate spaces in a data center, including spaces in which sets of power distribution infrastructure are not initially installed as part of initially installing a certain amount of minimum electrical infrastructure to support at least one live load. Commissioning the initial power distribution system can include verifying that the initial power distribution system is configured to support the maximum electrical power consumption of the multiple spaces. As a result, where the initial power distribution system has a power support capacity which at least meets the total live load which can be installed in the multiple spaces, commissioning the initial power distribution system includes verifying that the power distribution capacity of the initial primary power distribution system at least meets the total live load which can be installed in the multiple spaces.

In some embodiments, a set of power system mechanical infrastructure is configured to provide cooling support to at least the initially installed power distribution system. As a result, a set of power system mechanical infrastructure can be installed based on installation of the initial power distribution system. Commissioning the power system mechanical infrastructure can include verifying that the power system mechanical infrastructure is configured to support sufficient cooling of the initially-installed power distribution system so that operational temperatures of the initially-installed power distribution system remain below one or more high-temperature thresholds when the initially installed power distribution system supplies an amount of power which corresponds to the power support capacity of the initially-installed power distribution system.

Where the multiple spaces which the initial power distribution system is configured to support include spaces in which sets of power distribution infrastructure are not initially installed, the initial installation of the electrical infrastructure includes installing at least some instances of electrical infrastructure which extend to each of the multiple spaces in electrical parallel. Such installation can include installing power transmission lines and power distribution components, including busways, bus ducts, etc., which terminate in separate busway stub segments proximate to separate spaces of the multiple spaces. Each busway stub segment can be a portion of a separate future power busway which can be coupled to a power distribution system, including a busway segment which comprises one end of a future power busway which can be installed as part of future incremental installation of the electrical infrastructure.

Each busway stub segment can be coupled, via a power transmission line, to a separate busway disconnect switch, which is itself coupled, in parallel with other busway disconnect switches, to a power distribution system, such that a given busway disconnect switch is configured to selectively electrically couple or isolate a given busway stub segment from the power distribution system. Each busway stub segment can be mounted in a particular position relative to a separate space, such that the busway stub segment serves as a structural placeholder for the future position of a future power busway which can be installed in the space as part of future incremental installation of the electrical infrastructure.

In some embodiments, where initial installation of a minimum amount of an electrical and mechanical infrastructure includes installing an initial power distribution system, power system mechanical infrastructure, an initial set of power distribution infrastructure, and an initial set of mechanical infrastructure in an association with an initial space of a site, along with electrical infrastructure extending to each of the remaining spaces of the site in which sets of power distribution infrastructure and mechanical infrastructure are not installed, commissioning the initial power distribution system can include electrically coupling a set of load banks to the power distribution system, where the load banks collectively generate a total amount of electrical power consumption which simulates the maximum electrical power consumption which can be installed in the multiple spaces of the site and electrically coupled to the initial primary power distribution system, to verify that the power distribution is configured to support the maximum electrical power consumption which can be installed in the multiple spaces and electrically coupled to the initial primary power distribution system.

As a result of simulating the maximum electrical power consumption which can be installed in the multiple spaces of the site, to verify that the power distribution is configured to support the maximum electrical power consumption which can be installed in the multiple spaces and electrically coupled to the initial primary power distribution system, the power distribution system can generate heat as a result of supplying electrical power to provide such support. The generated heat corresponds to the heat generation as a result of supporting the maximum electrical power consumption which can be installed in the multiple spaces. The power system mechanical infrastructure can be operated to provide cooling support to the power distribution system concurrently with the power distribution system providing such support and generating heat. Where the power system mechanical infrastructure provides sufficient cooling support to the power distribution system, via removing heat from the power distribution system, to cause the operating temperatures associated with the power distribution system to be precluded from at least meeting high temperature thresholds, the power system mechanical infrastructure can be verified as being configured to provide cooling support to the power distribution system.

Coupling a set of load banks to the initial primary power distribution system can include coupling separate load banks to separate sets of power distribution infrastructure, power transmission lines, etc. so that the set of load banks are electrically coupled to the initial power distribution system in parallel and can collectively simulate the maximum electrical power consumption which can be installed in the multiple spaces via the separate maximum electrical power consumptions which can be installed in the separate spaces. As a result, commissioning the initial power distribution system can include commissioning the instances of electrical infrastructure which extend to the various spaces, as well as commissioning the initial sets of power distribution infrastructure installed in one or more spaces. Each separate load bank can be configured to provide a separate test load which corresponds to the maximum electrical power consumption which can be installed a given space of the site, and separate load banks can be coupled to separate sets of power distribution infrastructure installed in separate spaces in the data center.

Figure 3A:
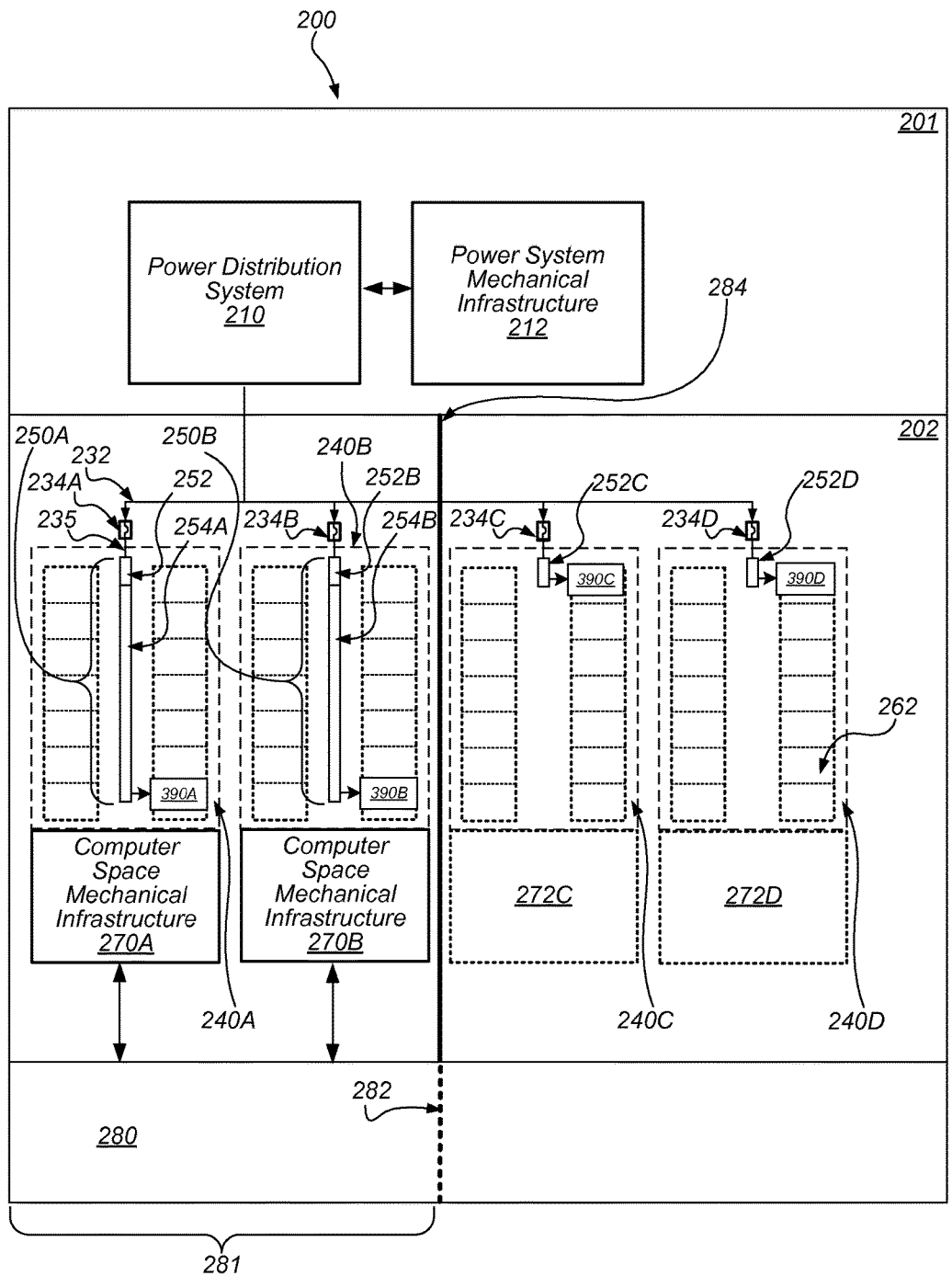
FIG. 3A is a schematic diagram illustrating commissioning a power system mechanical infrastructure and one or more sets of computer space mechanical infrastructure, concurrently with commissioning a power distribution system and one or more installed initial sets of power distribution infrastructure in initial computer spaces of a data center, according to some embodiments.

FIG. 3A is a schematic diagram illustrating commissioning a power system mechanical infrastructure and one or more sets of computer space mechanical infrastructure, concurrently with commissioning a power distribution system and one or more installed initial sets of electrical infrastructure in initial computer spaces of a data center, according to some embodiments. The data center 200 can include the data center 100 shown in FIG. 1.

As shown in FIG. 3A, initial installation of electrical infrastructure in a data center 200 includes installing an initial power distribution system 210, a set of power transmission lines 232, busway disconnect switches 234A-D, and busway stub segments 252A-D which extend the electrical infrastructure to each separate space 240A-D, and installing initial sets of power distribution infrastructure 250A-B in spaces 240A-B in which live loads are to be installed. For example, in the illustrated embodiment, each space 240 includes a total of 14 separate load spaces 261 in which separate live loads can be installed, and the illustrated installation of system 210, infrastructure 232, 234, 252A-D, and power distribution infrastructure sets 250A-B can be in response to a determination that more than 14 live loads are to be installed, such that power busways are required to be installed in at least two spaces 240A-B to support the live loads.

As further shown in FIG. 3A, initial installation of mechanical infrastructure in a data center 200 includes installing a set of power system mechanical infrastructure 212 which is configured to provide cooing support to power distribution system 210, installing separate sets of computer space mechanical infrastructure 270A-B which are each configured to provide cooling support to power distribution infrastructure 250 and live loads in separate spaces 240A-B, and installing common mechanical infrastructure 280 which is configured to support the sets of computer space mechanical infrastructure 270A-B. In some embodiments, where some or all of the sets of computer space mechanical infrastructure 270 are installed within common mechanical infrastructure 280, installing the common mechanical infrastructure 280 includes installing, as part of the common mechanical infrastructure 280 and in particular spaces included within a space associated with the common mechanical infrastructure, some or all of the sets of computer space mechanical infrastructure 270A-B which supply cooling air to each of the spaces 240A-B via instances of mechanical infrastructure which direct separate portions of the supplied cooling air to separate spaces 240A-B. In some embodiments, where an entirety of each set of computer space mechanical infrastructure 270 is separate from the common mechanical infrastructure 280 which provides support to each of the spaces 240 linked thereto via the sets of computer space mechanical infrastructure 270, each set of computer space mechanical infrastructure 270 can be installed in a separate space 272 which is proximate to a corresponding computer space. As shown, because sets of computer space mechanical infrastructure are not initially installed proximate to spaces 240C-D, spaces 272C-D remain exposed. In some embodiments, where each set of computer space mechanical infrastructure 270 includes one or more particular instances of mechanical infrastructure which comprise incremental portions of the common mechanical infrastructure 280 and one or more separate instances of mechanical infrastructure which direct at least one separate portion of cooling air supplied by infrastructure 280 to a separate space, installing a set of computer space mechanical infrastructure associated with a given space 240 includes installing the one or more particular instances of mechanical infrastructure included in the set in one or more spaces associated with the common mechanical infrastructure and installing the one or more separate instances of mechanical infrastructure included in the set in at least one corresponding space 272 which is proximate to the associated given computer space 240.

In some embodiments, initial installation of electrical infrastructure and mechanical infrastructure does not necessarily include installing additional power distribution systems 210. In some embodiments, one or more secondary power distribution systems, additional power distribution systems 210, additional sets of power system mechanical infrastructure 212, some combination thereof, etc. are installed as part of initial installation of electrical and mechanical infrastructure.

As shown, commissioning of the initially installed electrical infrastructure, including system 210 and sets 250A-B, includes electrically coupling a set of load banks 390A-D to the initial power distribution system 210 via the separate power pathways, through at least infrastructure components 232, 234A-D, 235, 252A-D. Each separate load bank 390 can be a test load which is configured to generate an amount of electrical power consumption which corresponds to the electrical power consumption by the maximum amount of live loads which can be installed in the spaces 261 in a given space 240, so that each separate load bank can simulate electrical power consumption by the maximum amount of live loads which can be installed in a separate space 240 and the set of load banks can collectively simulate electrical power consumption by the maximum amount of live loads which can be installed in the multiple spaces 240A-D and supported by initial power distribution system 210.

As shown, load banks 390C-D are each coupled to separate solitary busway stub segments 252C-D which are installed proximate to separate spaces 240C-D, where the load banks 390C-D can be operated to simulate electrical power consumption by the maximum amount of live loads which can be installed in the separate spaces 240C-D through infrastructure components 232, 234C-D, 235, and 252C-D, thereby verifying that the total live loads which can be installed in the separate spaces 240C-D can be supported by the initial power distribution system 210 and at least the electrical infrastructure 232, 234C-D, 235, 252C-D.

As shown, load banks 390A-B are each coupled to separate initial sets of power distribution infrastructure which are installed in separate spaces 240A-B, where the load banks 390A-B can be operated to simulate the electrical power consumption by the maximum amount of live loads which can be installed in the separate spaces 240A-B through infrastructure components 232, 234C-D, 235, and sets of power distribution infrastructure 250A-B, thereby verifying that electrical power consumption by the maximum amount of live loads which can be installed in the separate spaces 240A-B can be supported by the initial power distribution system 210 and at least the infrastructure 232, 234A-B, 235, 252A-B.

As shown, the load banks 390A-B are coupled to the separate sets of power distribution infrastructure 250A-B at respective distal ends of the busways 254 included in the sets 250A-B, relative to the proximate ends of the busways which are coupled to separate busway disconnect switches 234A-B and thus the initial power distribution system. As a result, operating the load banks 390A-B results in simulating the electrical power consumption by the maximum amount of live loads which can be installed in the spaces 240A-B via the respective entire lengths of the respective busways 254A-B, thereby enabling verification that the sets of power distribution infrastructure 250A-B are configured to support the electrical power consumption by the maximum amount of live loads which can be installed in the separate space 240A-B along an entire length of the respective power busways included in the sets.

Commissioning the initially-installed electrical infrastructure shown in FIG. 3A can include operating all load banks 390A-D concurrently to simulate the electrical power consumption by the maximum amount of live loads which can be installed in all spaces 240A-D on the initial primary power distribution system 210, so that the system 210 can be verified as being configured to support the maximum amount of live loads which can be installed in all spaces 240A-D and sets 250A-B.

Commissioning the initially-installed set of power system mechanical infrastructure 212 shown in FIG. 3A can include operating the set of power system mechanical infrastructure 212 to provide cooling support to system 210, such that the infrastructure 212 removes heat generated by the system 210 as a result of the system 210 supporting the test loads generated by the load banks 390A-D. Because the test loads simulate the electrical power consumption by the maximum amount of live loads which can be installed in the spaces 240A-D, and the power system 210 supports the test loads, the system 210 generates an amount of heat which corresponds to the heat generation which would result from supporting the maximum amount of live loads which can be installed in the spaces 240A-D. As a result of providing cooling support to system 210 concurrently with system 210 supporting the test loads generated by load bank 390A-D, the infrastructure 212 is verified as being configured to provide cooling support to the power distribution system 210. Providing cooling support can include circulating one or more coolants through one or more portions of the power distribution system 210, providing one or more streams of cooling air which remove heat generated by one or more portions of the system 210, etc. Providing cooling support can include providing one or more coolants, cooling air streams, etc. which remove sufficient generated heat from the power distribution system 210 to cause the operating temperatures of the one or more portions of the system 210 to remain below a set of high temperature thresholds associated with the one or more portions.

Commissioning the initially-installed set of computer space mechanical infrastructure 270A-B shown in FIG. 3A can include operating the sets of power system mechanical infrastructure 270A-B to provide cooling support to the load banks 390A-B and power distribution infrastructure sets 250A-B located in spaces 240A-B, such that the infrastructure 270A-B removes heat generated by the load banks 390A-B and infrastructure sets 250A-B as a result of the infrastructure sets 250A-B supplying electrical power to the load banks 390A-B to support the test loads which simulate electrical power consumption by the sets of electrical loads which can be installed in the spaces 240A-B. Because each test load 390 simulates the electrical power consumption by the maximum amount of live loads which can be installed in a respective space 240, and the set of power distribution infrastructure 250 installed in the space 240 supports the test load in the space, the load bank 390 and infrastructure set 250 located in a given space 240 generates an amount of heat which corresponds to the heat generation which would result from supporting the maximum amount of live loads which can be installed in the given space. As a result of providing cooling support to the load banks 390 and sets of power distribution infrastructure in a given space 240, concurrently with the set 250 supporting the test loads generated by the load banks 390 in the space, the infrastructure 270 installed proximate to the space is verified as being configured to provide cooling support to electrical loads and power distribution infrastructure installed in the space 240. Providing cooling support can include circulating one or more coolants through one or more portions of the power space 240, providing one or more streams of cooling air which remove heat generated by one or more portions of the space 240, etc. Providing cooling support can include providing one or more coolants, cooling air streams, etc. which remove sufficient generated heat from the space 240 to cause the operating temperatures of the one or more portions of the space 240 to remain below a set of high temperature thresholds associated with the one or more portions.

In some embodiments, commissioning an initial set of computer space mechanical infrastructure is implemented in isolation from portions of a facility, including a data center, in which at least some of deployed electrical infrastructure, mechanical infrastructure, and electrical loads are absent. As a result, the initial sets of computer space mechanical infrastructure can be verified as being configured to provide cooling support to the particular one or more initial spaces, independently of any dissipation of the mechanical support provided by the initial sets of computer space mechanical infrastructure amongst computer spaces in which one or more of electrical infrastructure, mechanical infrastructure, and electrical loads are not yet installed. The spaces in which one or more of electrical infrastructure, mechanical infrastructure, and electrical loads are not yet installed can be referred to as a remainder of the data center.

In some embodiments, commissioning an initial set of computer space mechanical infrastructure in isolation from a remainder of a data center includes erecting one or more partitions 284 which restrict airflow between the initial spaces 240A-B and at least a portion of the remainder of the data center 200 which includes the spaces 240C-D in for which sets of computer space mechanical infrastructure and power distribution infrastructure are not yet installed. In some embodiments, the partitioning can include at least partially partitioning at least a portion of the common mechanical infrastructure 280, via partitions 282, so that a particular portion 281 of the common mechanical infrastructure 280 supports the installed sets 270A-B.

In some embodiments, where common mechanical infrastructure 280 includes separate instances of mechanical infrastructure which are part of separate sets 270 of computer space mechanical infrastructure, erected partitions 282 within the common mechanical infrastructure can include partitions between separate instances of mechanical infrastructure which are included in separate sets of computer space mechanical infrastructure, such that cooling support provided by separate portions of the common mechanical infrastructure are provided, independently of each other, to separate computer spaces 240 with which the separate sets of computer space mechanical infrastructure are associated.

Figure 3B:
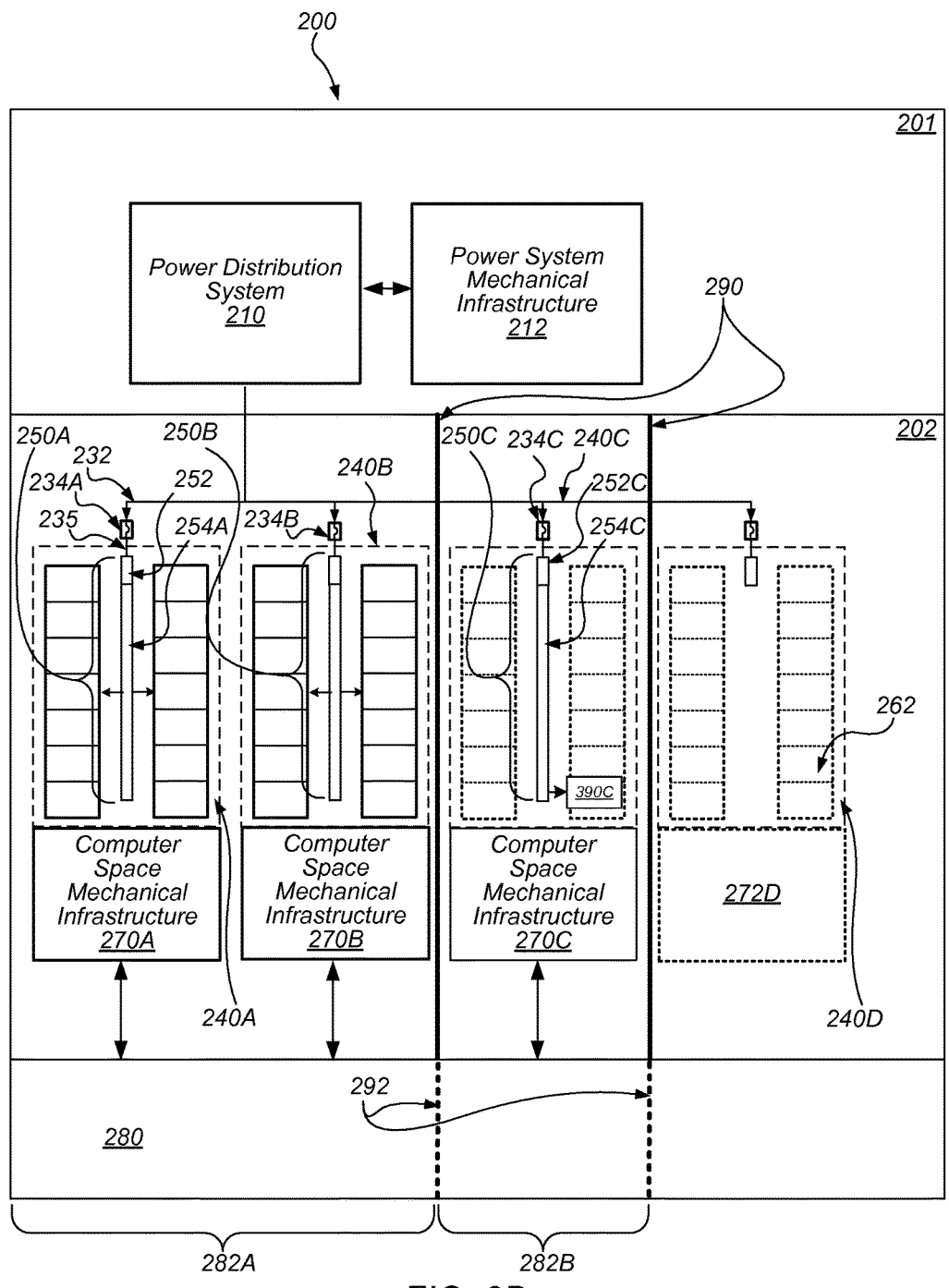
FIG. 3B is a schematic diagram illustrating incremental installation and commissioning of additional mechanical infrastructure, concurrently with incremental commissioning of additional sets of power distribution infrastructure in one or more additional computer spaces in a data center, according to some embodiments.

FIG. 3B is a schematic diagram illustrating incremental installation and commissioning of additional mechanical infrastructure, concurrently with incremental commissioning of additional sets of electrical infrastructure in one or more additional computer spaces in a data center, according to some embodiments. The data center 200 can include the data center 100 shown in FIG. 1.

In some embodiments, incremental installation of additional electrical infrastructure and mechanical infrastructure, subsequent to initial installation of a power distribution system and at least one initial set of power distribution infrastructure, includes installing and commissioning an additional set of power distribution infrastructure and a corresponding additional set of computer space mechanical infrastructure concurrently with the installed power distribution system supporting a live load.

Figure 4:
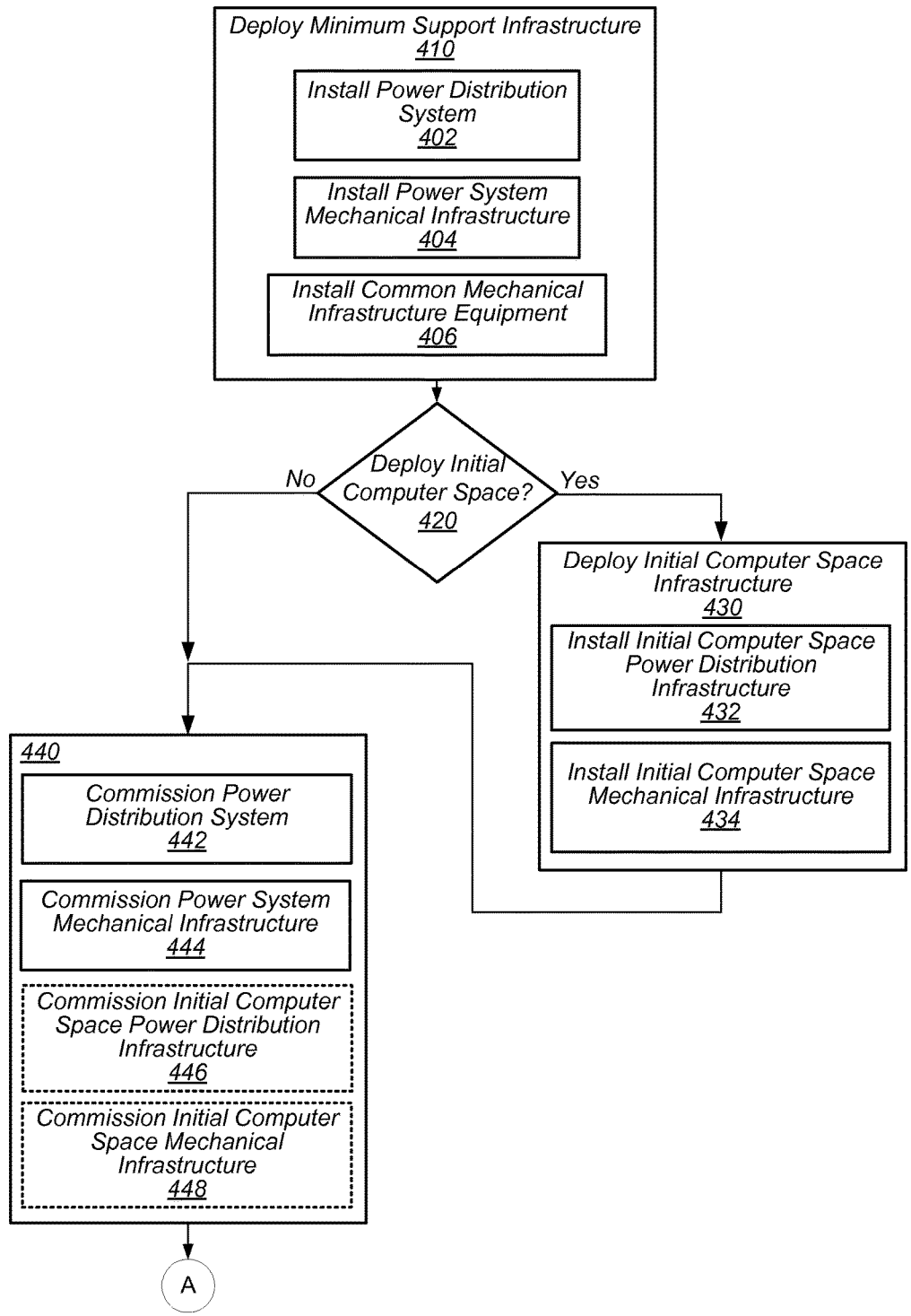
FIG. 4 illustrates initial installation and commissioning of mechanical infrastructure to support an initial set of electrical loads in a data center, according to some embodiments.

As shown in FIG. 4, initial sets of power distribution infrastructure 250A-B and computer space mechanical infrastructure 270A-B are installed in association with spaces 240A-B and two separate sets 260 of live loads 262 are installed in each of spaces 240A-B, so that the power distribution system 210 is supporting electrical power consumption by the total live loads 262 installed in spaces 240A-B, the set of power system mechanical infrastructure 212 is supporting cooling of the power distribution system 210 concurrently with system 210 supporting electrical power consumption by the total live loads 262 installed in spaces 240A-B, and the sets of computer space mechanical infrastructure 270A-B are supporting cooling of the live loads 262 and sets of power distribution infrastructure 250A-B installed in spaces 240A-B.

As shown, installing an additional set of power distribution infrastructure 250C in a space 240C includes coupling additional busway segments in series to the busway stub segment 252C which is already present in the space 240C. Installing an additional set of computer space mechanical infrastructure 270C proximate to space 240C can include coupling the set 270C to support infrastructure 280.

In some embodiments, commissioning an additional set of computer space mechanical infrastructure is implemented in isolation from the previously-installed sets of mechanical infrastructure, also referred to herein as deployed sets of computer space mechanical infrastructure, installed in the data center and the spaces of the data center in which live loads are installed and operating, so that the live loads supported by the deployed sets of computer space mechanical infrastructure are isolated from the additional set of computer space mechanical infrastructure during commissioning of the additional set of computer space mechanical infrastructure. As a result, the additional set of computer space mechanical infrastructure can be verified as being configured to provide cooling support to a space based on the heat removal from the space being influenced by the additional set of computer space mechanical infrastructure independently of the other installed sets of computer space mechanical infrastructure, live loads, etc. In addition, heat generated in an additional space as a result of commissioning electrical infrastructure and mechanical infrastructure in the additional space is precluded from affecting cooling support of live loads in a remainder of portions of the data center.

In some embodiments, commissioning an additional set of computer space mechanical infrastructure in isolation from a remainder of a data center includes erecting one or more partitions 290 which restrict airflow between the additional space 240C and at least a portion of the remainder of the data center 200 which includes the spaces 240A-B in which live loads are located and are receiving cooling support from sets 270A-B. In some embodiments, the partitioning can include at least partially partitioning at least a portion of the common mechanical infrastructure 280, via partitions 292, so that a particular portion 282A of the common mechanical infrastructure 280 supports the installed sets 270A-B and thus supports cooling of the live loads independently of the portion 282B which provides support to set 270C being commissioned.

In some embodiments, commissioning an additional set of computer space mechanical infrastructure in isolation from the live loads and installed sets of computer space mechanical infrastructure includes electrically coupling the additional set of power distribution infrastructure 250C installed in space 240C to a load bank 390C, where the load bank is configured to generate an amount of electrical power consumption which corresponds to the electrical power consumption by the maximum amount of live loads which can be installed in the same space 240C as the set 250C. As a result, the load bank can simulate the electrical power consumption by the maximum amount of live loads which can be installed in the space. The test load can be used to verify that the additional set of power distribution infrastructure 250C is configured to support the maximum amount of live loads which can be installed in the space. In addition, the load bank 390C and the set 250C can generate heat as a result of the load bank 390C generating the test load and the set of power distribution infrastructure 250C supplying power to support the test load. As shown, the load bank 390C is coupled to a distal end of the busway included in the set 250C, so that electrical power is supplied through an entirety of the busway to support the test load, thereby enabling verification that the power busway in set 250C can support the total live load which can be installed in the space along its entire length.

Commissioning the additional set of computer space mechanical infrastructure 270C can include operating the set 270C so that the set provides cooling support, via one or more of provided coolant circulation through space 240C, provided cooling air through space 240C, some combination thereof, etc., so that the set 270C removes, from space 240C, heat generated as a result of the set 250C supporting the test load generated by bank 390C.

Upon completion of the verification, commissioning of set 270C can be completed, upon which the set 370C can be adjusted, via operation of one or more computer systems, to operate in unison with the installed sets of computer space mechanical infrastructure 270A-B. Upon completion of the adjustment, partitions 290, 292 can be removed, and the sets of computer space mechanical infrastructure 270A-C can be operated in unison.

In some embodiments, commissioning one or more sets of mechanical infrastructure, including one or more sets of power system mechanical infrastructure, one or more sets of computer space mechanical infrastructure, some combination thereof, etc. is implemented independently of installation and commissioning of electrical infrastructure. For example, where an amount of heat which a set of mechanical infrastructure is configured to remove within a certain period of elapsed time can be associated with one or more of a particular volumetric flow rate of air, flow velocity of air, mass flow rate of air, etc., verifying the set of mechanical infrastructure as being configured to remove the amount of heat can include installing the set of mechanical infrastructure, operating the mechanical infrastructure so that the set of mechanical infrastructure induces an air flow through a space, and verifying, via sensor data generated by one or more sensor devices located in the space, that the air flow generated by the set of mechanical infrastructure at least meets the one or more of the particular volumetric flow rate of air, flow velocity of air, mass flow rate of air, etc., which is associated with the amount of heat that the set of mechanical infrastructure is configured to remove within a given period of time.

FIG. 4 illustrates initial installation and commissioning of mechanical infrastructure to support an initial set of electrical loads in a data center, according to some embodiments. The initial installation and commissioning can be implemented with regard to any of the embodiments of mechanical infrastructure, power distribution systems, power distribution infrastructures, etc. included herein.

At 410, a minimum amount of support infrastructure which is configured to support at least one live load in a data center is installed, also referred to herein as being deployed, in a data center. At 402, the minimum infrastructure deployment includes installing an initial power distribution system which comprises a power distribution system. A power distribution system can include one or more power distribution components, which can include one or more transformers, generators, transfer switches, distribution switchboards, uninterruptible power supplies, power distribution units, power distribution panels, some combination thereof, etc. In some embodiments, where a data center is configured to accommodate multiple primary power distribution systems, the installing at 402 can include one or more of installing a single power distribution system, multiple independent power distribution systems, etc. In some embodiments, installing a power distribution system can include installing at least a portion of an Electric Power Monitoring System (EPMS).

At 404, the minimum infrastructure deployment includes installing a set of power system mechanical infrastructure which is configured to provide cooling support to the installed initial power distribution system. At 406, the minimum infrastructure deployment includes installing one or more instances of common mechanical infrastructure, including one or more coolant plants, intake air headers, etc. which support the installed power system mechanical infrastructure.

At 420, a determination is made regarding whether to deploy an initial computer space, prior to commissioning the installed power distribution system and power system mechanical infrastructure. If so, at 430, initial computer space infrastructure configured to support at least one live load in an initial computer space is deployed.

At 432, deploying the initial computer space infrastructure configured to support at least one live load in an initial computer space includes installing an initial set of power distribution infrastructure in association with the initial computer space. The initial set of power distribution infrastructure can include a power busway which extends through the initial computer space and is configured to supply electrical power from the power distribution system to a set of live loads installed in the initial computer space.

At 434, deploying the initial computer space infrastructure configured to support at least one live load in an initial computer space includes installing an initial set of computer space mechanical infrastructure in association with the initial computer space. The initial set of computer space mechanical infrastructure can include one or more air handling units, air cooling units, air moving devices, coolant circulation devices, etc. which are installed in one or more positions proximate to the initial computer space and are configured to remove heat generated by live loads, power distribution infrastructure, etc. in the initial computer space.

At 440, installed support infrastructure in the data center is commissioned as being configured to support live loads. The commissioning at 440 includes, at 442, commissioning the power distribution system. Such commissioning can include, as part of verifying that the power distribution system is configured to support electrical power consumption by a plurality of sets of electrical loads in the data center, coupling a set of load banks, where each load bank is configured to generate a test load which simulates the electrical power consumption of a separate set of electrical loads, in parallel with the power distribution system, so that the electrical power consumption of the plurality of sets of electrical loads is simulated by a plurality of test loads generated by the load banks, and the power distribution system is operated to support the test load. Where the power distribution system supports the test load, the power distribution system can be verified as being configured to support electrical power consumption by the plurality of electrical loads.

The commissioning at 440 includes, at 444, commissioning the power system mechanical infrastructure. Such commissioning at 444 can be implemented concurrently with the commissioning, at 442, of the power distribution system. Operating the power distribution system to support the test loads generated by the plurality of load banks coupled in parallel with the power distribution system can result in one or more power distribution components, instances of power distribution infrastructure, etc. included in the power distribution system generating heat. Because the power distribution system is supporting a collective test load which simulates the electrical power consumption of the plurality of sets of electrical loads, the amount of heat generated by the power distribution system as a result of providing such support can correspond to the amount of heat generated by the power distribution system concurrently with providing electrical power support to the plurality of sets of electrical loads. The commissioning, at 444, can include operating one or more portions of the power system mechanical infrastructure to remove heat generated by one or more portions of the power distribution system, concurrently with the power distribution system supporting the simulated electrical power consumption of the plurality of sets of electrical loads.

The power system mechanical infrastructure can be verified as providing sufficient cooling support to the power distribution system, where such support can be provided via one or more of one or more cooling air streams, circulated coolant streams, etc., where the power systems mechanical infrastructure removes sufficient amounts of heat from the power distribution system to maintain steady-state operating temperatures of one or more portions of the power distribution system beneath one or more high-temperature thresholds associated with the one or more portions. Where the power system mechanical infrastructure causes the steady-state operating temperatures of the one or more portions of the power distribution system to remain beneath one or more high-temperature thresholds associated with the one or more portions, concurrently with the power distribution system supporting the simulated electrical power consumption of the plurality of sets of electrical loads, the power system mechanical infrastructure can be verified as being configured to support the power distribution system.

In some embodiments, the commissioning at 444 includes implementing various component-level tests with regard to the power system mechanical infrastructure. Such testing can include implementing testing of various individual components, also referred to herein as instances of equipment, included in the set of power system mechanical infrastructure.

Where the power system mechanical infrastructure includes one or more components which include one or more air handling units, such component-level testing of an air handling unit can include one or more of recording one or more of a unit tag, model number, serial number, etc. associated with various components; physical confirmation of proper unit installation; verifying execution of start and stop commands by the unit from one or more of a unit webpage and a building automation system (BAS) server, such that the unit is verified as moving to proper positions when the unit is commanded to be turned on and turned off; commanding the unit to operate in free cooling mode and confirming mixed air temperature and supply air temperature control, along with damper response; commanding the unit to operate in evaporative cooling mode and confirming supply air temperature control damper response and local control of evaporative cooling components; commanding unit air moving device operating speeds via a BAS to verify unit response to commands and stable air moving device operations across an entire operating range; verifying a dryout cycle function and duration when switching the unit from evaporative cooling to free cooling; verify dump cycle operation, schedule, and duration, including verifying that the dump cycle only initiates while the unit is in free cooling mode and verifying a duration is appropriate to completely empty sump; verifying operation of local unit hand/off/auto (HOA) selector switch, where the HOA switch is placed in each position and unit response is verified; overriding the unit to purge mode locally and verifying unit response; and verifying component responses to component failures and alarm conditions.

Where the power system mechanical infrastructure includes one or more components which include one or more air moving devices, exhaust air fans, such component-level testing of such a device can include one or more of recording one or more of recording one or more of a tag, model number, and serial number of the device; physically confirming proper device installation; verifying start and stop commands from a BAS and verifying that device components move to proper positions when the device is commanded on and off; commanding device fan speed via BAS to verify that the device responds to commands and a fan included therein operates stably across an entire operating range; placing the device in local control and operating the device at limits and verifying proper device response and BAS monitoring; overriding the device to purge mode locally and verifying device response; and verifying device responses to component failures and alarm conditions.

Where the set of power system mechanical infrastructure includes one or more additional unitary components, including one or more split systems, energy recovery ventilators, roof top air handling units, etc., such component-level testing of such a component can include one or more of recording one or more of a tag, model number, and serial number of the component; physically confirming proper component installation; verifying normal operation of the component in conjunction with any BAS control and monitoring verification; and verifying component responses to component failures and alarm conditions.

In some embodiments, the commissioning at 444 includes implementing various system-level tests with regard to one or more of the power system mechanical infrastructure and one or more instances of installed common mechanical infrastructure.

Where the set of power system mechanical infrastructure includes one or more HVAC systems, the system-level tests can include one or more of verifying system response when entire system is disabled; verifying system startup response when enabled; verifying that system operating mode is correctly selected based on ambient conditions; verifying system operation once operating in both free cooling mode and evaporative cooling mode; verifying system transition between modes; verifying that the system operates in unison as required; verifying that the supply air temperature setpoint for the system is reset as necessary based on ambient conditions; verifying system operation based on fan speed of a supply fan included in the system; verifying that the system operates stably to maintain a current setpoint and any reset range; verifying fan speed setpoint adjusts to maintain control parameters; verifying system operation based on room versus vs. ambient air setpoints; verifying that the system operates stably to maintain current setpoint and any reset range; verifying system response when a central BAS controller is failed while operating under loaded conditions; verifying system response to failures of CRAHU's and EF's while operating under loaded conditions; verifying system response to activation of purge mode while operating under loaded conditions, where purge mode is initiated automatically by changing a setpoint at a purge panel; and performing capacity verification on the system load.

Where the set of common mechanical infrastructure includes one or more industrial water systems, the system-level tests can include one or more of recording one or more of a tag, model number, and serial number of the component; physically confirming proper component installation; verifying system operation and BAS monitoring while operating only on utility water pressure; verifying system operation and BAS control/monitoring of UV skids and tank water treatment control; verifying system operation and BAS control/monitoring when placed in dry storage mode and storage tanks are drained for off season operation; verifying system operating and BAS control/monitoring upon deactivation from dry storage mode and enter tank fill mode to fill storage tanks; verifying system operation and BAS control/monitoring with system operation utilizing storage tank water; monitoring system performance and ensuring that it is able to meet system demand with system operating in evaporative cooling mode and all AHU's and CRAH's in demand for make-up water; and verifying system responses to component failures and alarm conditions.

In some embodiments, the commissioning at 444 includes implementing various integrated system-level tests with regard to one or more of the power system mechanical infrastructure and one or more instances of installed common mechanical infrastructure. Such testing can include one or more of verifying loading of the power system mechanical infrastructure supporting the power distribution system, where BAS temperature, humidity, and differential pressure sensors in the rooms are employed to record and trend the HVAC operating conditions throughout the test. The test can begin with no load bank load on the power distribution system. Load bank load can be applied in various steps. Load can continue to be stepped until reaching design electrical load for the plurality of sets of electrical loads. Proper reaction from the mechanical infrastructure can be documented and can be expected to reach steady state between the load steps up to design full electrical load.

Integrated system-level tests with regard to one or more of the power system mechanical infrastructure and one or more instances of installed common mechanical infrastructure can include, with the data center at full available load, initiating a loss of the utility service at the main switchboard of the power distribution system and verifying facility critical load is carried on the UPS system as the facility transfers to the diesel Generators, verifying that mechanical infrastructure restarts and that space temperatures or critical equipment rooms remains within thresholds.

Integrated system-level tests with regard to one or more of the power system mechanical infrastructure and one or more instances of installed common mechanical infrastructure can include, with the data center operating on generator at full available load, restoring the utility service at the main switchboard of the power distribution system, verifying that the loads are transferred back to the utility service, verifying that mechanical infrastructure restarts and that space temperatures or critical equipment rooms remains within thresholds.

Integrated system-level tests with regard to one or more of the power system mechanical infrastructure and one or more instances of installed common mechanical infrastructure can include verifying mechanical system redundancy while under full load conditions. Test will occur while under full electrical load. Redundant components can be disabled and system responses can be monitored. Temperature and relative humidity levels are monitored for returns to steady state conditions while the redundant mechanical equipment are not available for use.

Integrated system-level tests with regard to one or more of the power system mechanical infrastructure and one or more instances of installed common mechanical infrastructure can include verifying mechanical system response to the loss of utility water supply while operating under full load conditions with the CRAH units operating in evaporative cooling mode.

Integrated system-level tests with regard to one or more of the power system mechanical infrastructure and one or more instances of installed common mechanical infrastructure can include verifying unloading of the mechanical infrastructure. BAS temperature, humidity, and differential pressure sensors in the rooms can be employed to record and trend the HVAC operating conditions throughout the test. The test can begin with load banks loaded to design electrical load. Load bank load can be reduced in various steps. Load can continue to be stepped down until reaching no load bank load. Proper reaction from the AHU's, CRAHU's, and EF's can be documented and systems can be expected to reach steady state between the load steps down from design full electrical load.

In some embodiments, where one or more initial computer spaces are deployed at 430, the commissioning at 440 can include commissioning an initial computer space power distribution infrastructure set at 446 and concurrently commissioning an initial set of computer space mechanical infrastructure at 448. Such commissioning can include, as part of commissioning the power distribution system at 442, coupling one or more load banks in the initial computer space to a portion of the initial set of power distribution infrastructure in the space, so that the initial set of power distribution infrastructure supplies electrical power to the load banks, which are generating at test load that simulates electrical power consumption by a maximum amount of electrical loads which can be installed in the initial computer space, through an entirety of the set of power distribution infrastructure. Such supplying can result in heat generation by the power distribution infrastructure and the one or more coupled load banks, where the generated heat corresponds to an amount of heat generated when a set of electrical loads is installed in the initial computer space and is provided electrical power support by the initial set of computer space power distribution infrastructure. The initial set of computer space mechanical infrastructure can be operated, concurrently with the initial set of computer space power distribution infrastructure supporting the test loads in the initial computer space, so that the computer space mechanical infrastructure removes the heat generated as a result of the power distribution infrastructure supporting the test loads generated by the load banks in the initial computer space. Where the cooling provided by the mechanical infrastructure causes the steady-state operating temperatures in the initial computer space to remain below one or more thresholds, the initial set of computer space mechanical infrastructure can be verified as being configured to provide cooling support to electrical loads installed in the initial computer space.

The commissioning at 448 can include implementing one or more various tests associated with the computer space mechanical infrastructure, and such tests can be similar to tests which can be implemented, at 444, as part of commissioning the power system mechanical infrastructure.

Upon completion of the commissioning at 440 the installed electrical infrastructure, including the installed power distribution system and the installed initial sets of computer space power distribution infrastructure, and the installed mechanical infrastructure, including the installed power system mechanical infrastructure and the installed sets of computer space mechanical infrastructure, will be verified as ready to support electrical loads in the one or more initial computer spaces.

Figure 5:
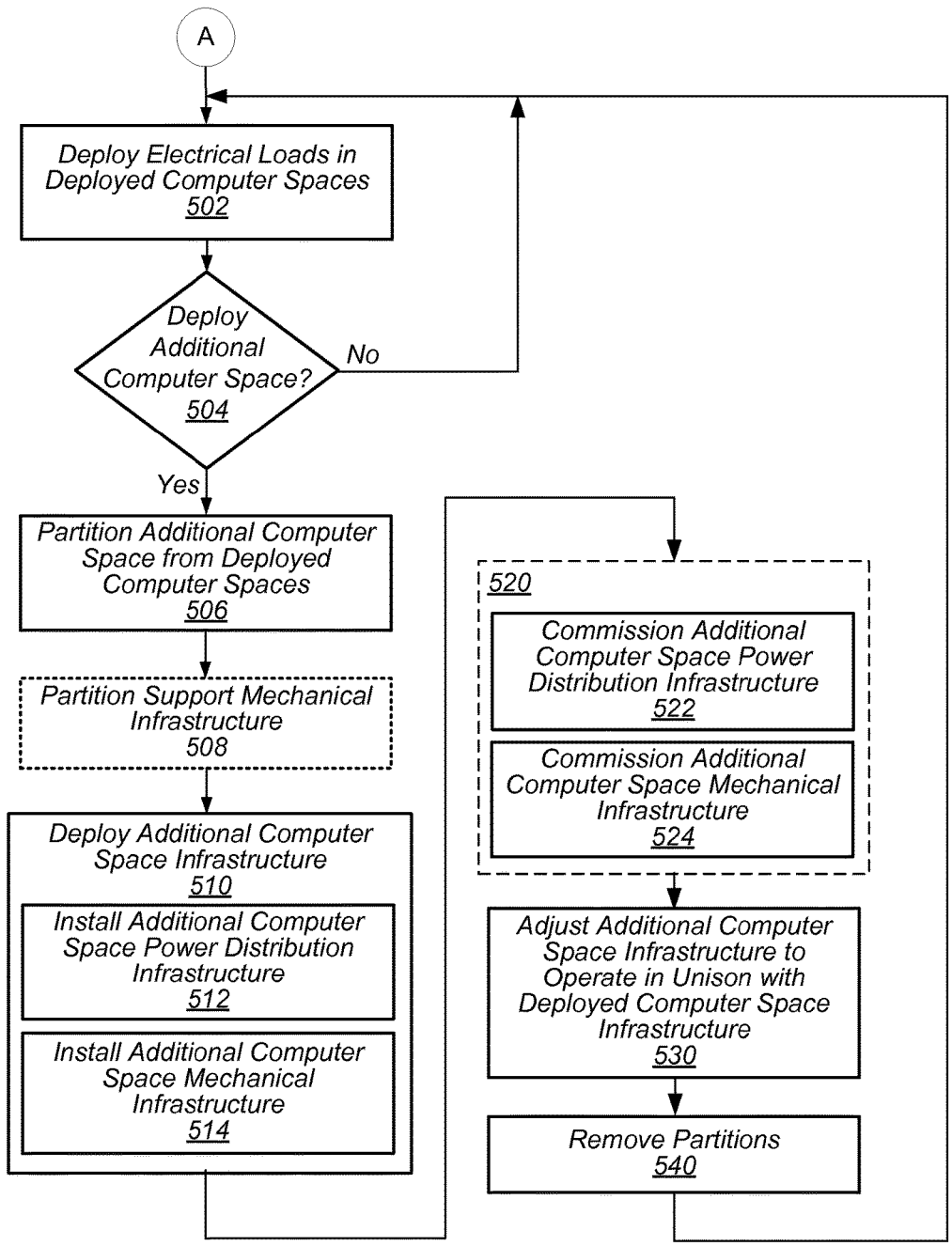
FIG. 5 illustrates incremental installation and commissioning of mechanical infrastructure to support incremental expansion of electrical loads in a data center, according to some embodiments.

FIG. 5 illustrates incremental installation and commissioning of mechanical infrastructure to support incremental expansion of electrical loads in a data center, according to some embodiments. The incremental installation and commissioning can be implemented with regard to any of the embodiments of mechanical infrastructure, power distribution systems, power distribution infrastructures, etc. included herein.

As shown from element "A" illustrated in FIG. 4-5, the incremental installation and commissioning of mechanical infrastructure in a data center is implemented subsequent to installation and commissioning of power system mechanical infrastructure and initial computer space mechanical infrastructure.

At 502, one or more sets of electrical loads are installed in computer spaces for which corresponding computer space electrical and mechanical infrastructure has been installed and commissioning. Installing an electrical load can include mounting the electrical load in one or more particular positions in the computer space which exposes the electrical load to receiving cooling support from the associated computer space mechanical infrastructure and electrically coupling the electrical load to the associated computer space power distribution infrastructure so that the electrical load receives electrical power support. The installed electrical loads which receive electrical power support can include live loads.

At 504, a determination is made regarding whether to deploy an additional computer space. If so, at 506, the additional space is partitioned from computer spaces, in a remainder of the data center, in which live loads are installed and operating. Such partitioning can include erecting one or more partitions which restrict airflow between the additional computer space and the spaces in which live loads are deployed.

In some embodiments, as shown at 508, one or more portions of common mechanical infrastructure are partitioned, so that support is provided to mechanical infrastructure supporting live loads independently of support provided to mechanical infrastructure supporting test loads in the additional computer space.

At 510, additional computer space infrastructure configured to support at least one live load in the additional computer space is deployed. At 512, deploying the additional computer space infrastructure configured to support at least one live load in the additional computer space includes installing an additional set of power distribution infrastructure in association with the additional computer space. The additional set of power distribution infrastructure can include a power busway which extends through the additional computer space and is configured to supply electrical power from the power distribution system to a set of live loads installed in the additional computer space.

At 514, deploying the additional computer space infrastructure configured to support at least one live load in the additional computer space includes installing an additional set of computer space mechanical infrastructure in association with the additional computer space. The additional set of computer space mechanical infrastructure can include one or more air handling units, air cooling units, air moving devices, coolant circulation devices, etc. which are installed in one or more positions proximate to the additional computer space and are configured to remove heat generated by live loads, power distribution infrastructure, etc. in the additional computer space.

At 520, the installed additional support infrastructure is commissioned as being configured to support live loads in the additional computer space. The commissioning at 520 includes commissioning the additional set of computer space power distribution infrastructure set at 522 and concurrently commissioning the additional set of computer space mechanical infrastructure at 524. Such commissioning can include coupling one or more load banks in the additional computer space to a portion of the additional set of power distribution infrastructure in the space, so that the additional set of power distribution infrastructure supplies electrical power to the load banks, which are generating at test load that simulates electrical power consumption by a maximum amount of electrical loads which can be installed in the additional computer space, through an entirety of the additional set of power distribution infrastructure. Such supplying can result in heat generation by the power distribution infrastructure and the one or more coupled load banks, where the generated heat corresponds to an amount of heat generated when a set of electrical loads is installed in the additional computer space and is provided electrical power support by the additional set of computer space power distribution infrastructure. The additional set of computer space mechanical infrastructure can be operated, concurrently with the additional set of computer space power distribution infrastructure supporting the test loads in the additional computer space, so that the additional set of computer space mechanical infrastructure removes the heat generated as a result of the power distribution infrastructure supporting the test loads generated by the load banks in the additional computer space.

Where the cooling provided by the additional set of mechanical infrastructure causes the steady-state operating temperatures in the additional computer space to remain below one or more thresholds, the additional set of computer space mechanical infrastructure can be verified as being configured to provide cooling support to electrical loads installed in the additional computer space. The commissioning can include, based on the partitioning of the additional computer space, providing cooling support to the power distribution infrastructure and load banks in the additional computer space independently of the deployed mechanical infrastructure providing cooling support to live loads deployed in one or more other computer spaces isolated from the additional computer space via partitioning.

The commissioning at 520 can include implementing one or more various tests associated with the computer space mechanical infrastructure, and such tests can be similar to tests which can be implemented, at 444 in FIG. 4, as part of commissioning the power system mechanical infrastructure.

At 530, based on completion of the commissioning at 520, adjusting the additional set of computer space mechanical infrastructure to operate in unison with the deployed sets of computer space mechanical infrastructure. Such adjusting can include adjusting the additional set of computer space mechanical infrastructure to provide a common amount of cooling support as the deployed sets of computer space mechanical infrastructure; adjusting one or more components of the additional set of computer space mechanical infrastructure to cause one or more environmental parameters of the additional computer space, including air pressure, temperature, etc., to be adjusted to at least approximate one or more environmental parameters of one or more deployed computer spaces, etc. At 540, the partitions are removed.

Figure 6:
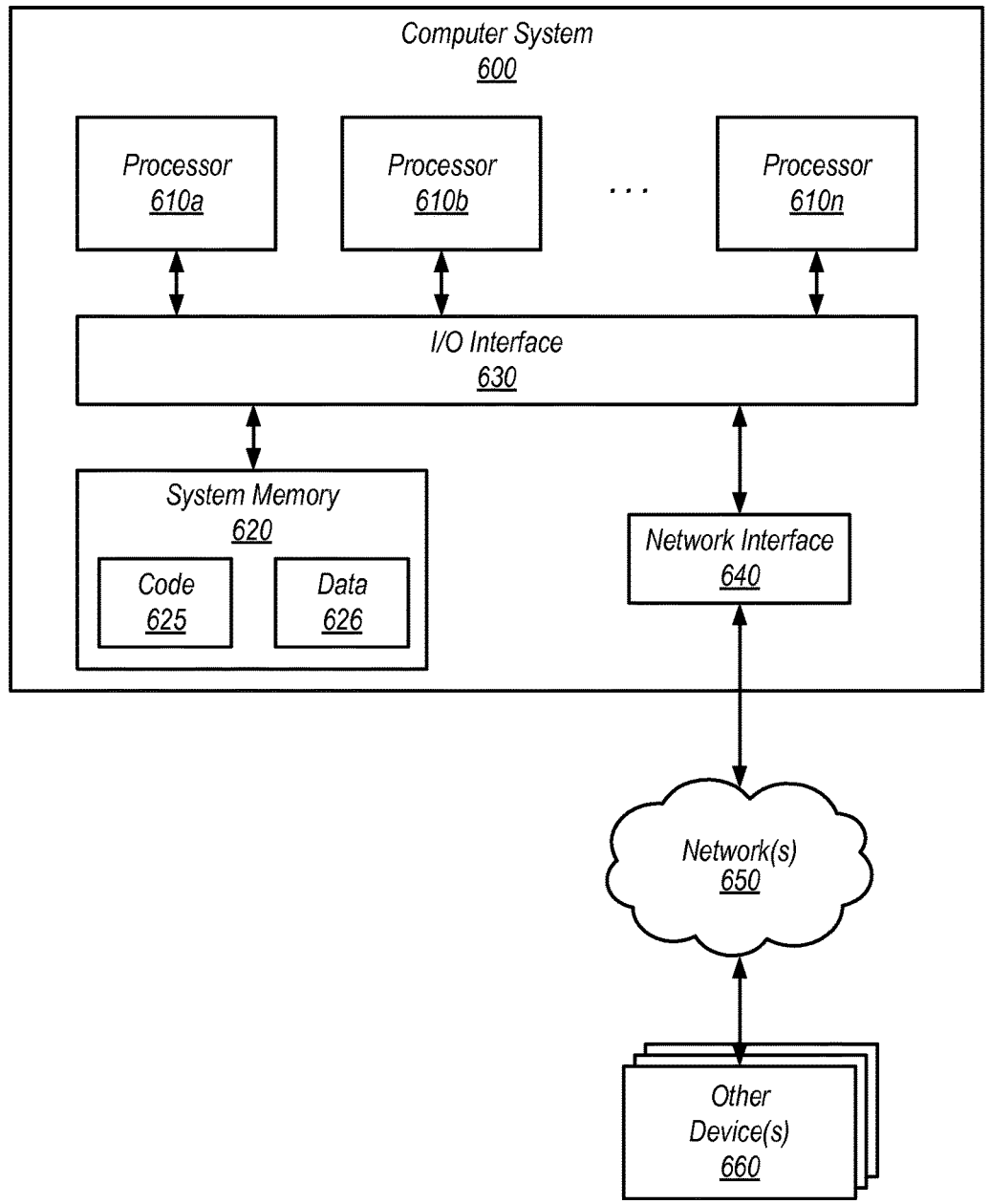
FIG. 6 is a block diagram illustrating an example computer system that may be used in some embodiments.

FIG. 6 is a block diagram illustrating an example computer system that may be used in some embodiments.

In some embodiments, a system that implements a portion or all of one or more of the technologies, methods, systems, devices, and apparatuses as described herein may include a general-purpose computer system that includes or is configured to access one or more computer-accessible media, such as computer system 600 illustrated in FIG. 6. In the illustrated embodiment, computer system 600 includes one or more processors 610 coupled to a system memory 620 via an input/output (I/O) interface 630. In some embodiments, computer system 600 further includes a network interface 640 coupled to I/O interface 630. In some embodiments, computer system 600 is independent of a network interface and can include a physical communication interface that can couple with a communication pathway, including a communication cable, power transmission line, etc. to couple with various external components, systems, etc.

In various embodiments, computer system 600 may be a uniprocessor system including one processor 610, or a multiprocessor system including several processors 610 (e.g., two, four, eight, or another suitable number). Processors 610 may be any suitable processors capable of executing instructions. For example, in various embodiments, processors 610 may be general-purpose or embedded processors implementing any of a variety of instruction set architectures (ISAs), such as the x86, PowerPC, SPARC, or MIPS ISAs, or any other suitable ISA. In multiprocessor systems, each of processors 610 may commonly, but not necessarily, implement the same ISA.

System memory 620 may be configured to store instructions and data accessible by processor(s) 610. In various embodiments, system memory 620 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of one or more of the technologies, methods, systems, devices, and apparatuses as described herein, are shown stored within system memory 620 as code 625 and data 626.

In one embodiment, I/O interface 630 may be configured to coordinate I/O traffic between processor 610, system memory 620, and any peripheral devices in the device, including network interface 640 or other peripheral interfaces. In some embodiments, I/O interface 630 may perform any necessary protocol, timing or other data transformations to convert data signals from one component (e.g., system memory 620) into a format suitable for use by another component (e.g., processor 610). In some embodiments, I/O interface 630 may include support for devices attached through various types of peripheral buses, such as a variant of the Peripheral Component Interconnect (PCI) bus standard or the Universal Serial Bus (USB) standard, for example. In some embodiments, the function of I/O interface 630 may be split into two or more separate components, such as a north bridge and a south bridge, for example. Also, in some embodiments some or all of the functionality of I/O interface 630, such as an interface to system memory 620, may be incorporated directly into processor 610.

Network interface 640 may be configured to allow data to be exchanged between computer system 600 and other devices 660 attached to a network or networks 650, such as other computer systems, components, processor units, or devices as illustrated in FIGS. 1 through 5, for example. In various embodiments, network interface 640 may support communication via any suitable wired or wireless general data networks, such as types of Ethernet network, for example. Additionally, network interface 640 may support communication via telecommunications/telephony networks such as analog voice networks or digital fiber communications networks, via storage area networks such as Fibre Channel SANs, or via any other suitable type of network and/or protocol.

In some embodiments, system memory 620 may be one embodiment of a computer-accessible medium configured to store program instructions and data for implementing embodiments of a portion or all of one or more of the technologies, methods, systems, devices, and apparatuses as described herein relative to FIGS. 1-5. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 600 via I/O interface 630. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 600 as system memory 620 or another type of memory. Further, a computer-accessible medium may include transmission media or signals such as electrical, electromagnetic, or digital signals, conveyed via a communication medium such as a network and/or a wireless link, such as may be implemented via network interface 640.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD- ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method for incrementally commissioning mechanical infrastructure in a data center, wherein the method comprises:
   installing a power distribution system in the data center, where the power distribution system is configured to provide electrical power support to a plurality of sets of rack computer systems in a plurality of computer spaces in the data center;
   installing a set of power system mechanical infrastructure which is configured to provide cooling support to the power distribution system;
   verifying that the set of power system mechanical infrastructure is configured to provide cooling support to the power distribution system, wherein the verifying comprises:
      simulating electrical power consumption by the plurality of sets of rack computer systems, based on operation of a set of load banks electrically coupled to the power distribution system, wherein the set of load banks are test loads that simulate the electrical power consumption of one or more live loads, such that the power distribution system generates heat as a result of supporting the simulated electrical power consumption by the plurality of sets of rack computer systems; and
      operating the set of power system mechanical infrastructure, concurrently with the power distribution system supporting the simulated electrical power consumption by the plurality of sets of rack computer systems, such that the set of power system mechanical infrastructure removes the heat generated by the power distribution system as a result of supporting the simulated electrical power consumption by the plurality of sets of rack computer systems;
   installing a set of power distribution infrastructure in a computer space, of the plurality of computer spaces, such that the set of power distribution infrastructure is configured to supply electrical power received from the power distribution infrastructure to rack computer systems installed in the computer space;
   installing a set of computer space mechanical infrastructure proximate to the computer space, wherein the set of computer space mechanical infrastructure is configured to provide cooling support to a set of rack computer systems, of the plurality of sets of rack computer systems, and power distribution infrastructure located in the computer space; and
   verifying that the set of computer space mechanical infrastructure is configured to provide cooling support to a set of rack computer systems, of the plurality of sets of rack computer systems, and power distribution infrastructure located in the computer space, wherein the verifying comprises:
      simulating electrical power consumption by the set of rack computer systems in the computer space, based on operation of at least one load bank electrically coupled to the set of power distribution infrastructure in the computer space, wherein the at least one load bank is at least one test load that simulates the electrical power consumption of one or more live loads, such that the power distribution infrastructure generates heat, in the computer space, as a result of supporting the simulated electrical power consumption by the set of rack computer systems; and
      operating the set of computer space mechanical infrastructure, concurrently with the power distribution infrastructure supporting the simulated electrical power consumption by the set of rack computer systems in the computer space, such that the set of computer space mechanical infrastructure removes, from the computer space, the heat generated by the power distribution infrastructure as a result of supporting the simulated electrical power consumption by the set of rack computer systems.

2. The method of claim 1, wherein:
   the verifying that the set of computer space mechanical infrastructure is configured to provide cooling support to the set of rack computer systems and power distribution infrastructure located in the computer space comprises partitioning the computer space from a remainder of the data center, such that:
      airflow between the computer space and the remainder of the data center is restricted; and
      cooling support provided to the computer space via operation of the set of computer space mechanical infrastructure is isolated from being provided to rack computer systems located in the remainder of the data center.

3. The method of claim 2, wherein:
   the remainder of the data center comprises:
      a deployed set of rack computer systems consuming electrical power supplied by the power distribution system, and
      a deployed set of computer space mechanical infrastructure providing cooling support to the separate set of rack computer systems;
   the verifying that the set of computer space mechanical infrastructure is configured to provide cooling support to the set of rack computer systems and power distribution infrastructure located in the computer space comprises:
      simulating electrical power consumption by the of set of rack computer systems in the computer space in isolation from the remainder of the data center, such that heat generated in the computer space is restricted from reaching the deployed set of rack computer systems; and
   the method further comprises, subsequent to verifying that the set of computer space mechanical infrastructure is configured to provide cooling support to the set of rack computer systems and power distribution infrastructure located in the computer space:

adjusting the set of computer space mechanical infrastructure to operate in unison with the deployed set of computer space mechanical infrastructure.

4. The method of claim 1, wherein the simulating electrical power consumption by the plurality of sets of rack computer systems is performed prior to installation of the plurality of sets of rack computer systems in the data center and comprises:
electrically coupling the set of load banks, in parallel, to the power distribution system;
wherein each separate load bank, of the set of load banks, is configured to simulate electrical power consumption by a separate set of rack computer systems, of the plurality of sets of rack computer systems, such that the set of load banks collectively simulate electrical power consumption by the plurality of sets of rack computer systems.

5. The method of claim 4, wherein:
the simulating electrical power consumption, by the plurality of sets of rack computer systems, comprises:
coupling an initial load bank, of the set of load banks, to an initial set of power distribution infrastructure, in an initial computer space, which is electrically coupled to the power distribution system, such that the initial set of power distribution infrastructure generates heat as a result of supporting the simulated electrical power consumption of at least one initial set of rack computer systems in the initial computer space; and
the verifying further comprises operating a set of initial computer space mechanical infrastructure, concurrently with the initial set of power distribution infrastructure supporting the simulated electrical power consumption of the at least one initial set of rack computer systems in the initial computer space, such that operating temperatures in each portion of the initial computer space remain less than threshold operating temperatures associated with a respective portion of the initial computer space.

6. The method of claim 5, comprising:
verifying that the set of power system mechanical infrastructure in the data center is configured to provide cooling support to an additional set of rack computer systems, of the plurality of sets of rack computer systems, in an additional computer space, of the plurality of computer spaces, wherein the verifying the set of power system mechanical infrastructure comprises, subsequently to installing the initial set of rack computer system in the initial computer space:
simulating electrical power consumption by the additional set of rack computer systems in the additional computer space, based on supplying electrical power through an additional set of power distribution infrastructure to an additional load bank in the additional computer space, such that an additional power busway generates heat in the additional computer space as a result of supporting the simulated electrical power consumption by the additional set of rack computer systems; and
operating an additional set of computer space mechanical infrastructure, concurrently with the additional set of power distribution infrastructure supporting the simulated electrical power consumption by the additional of set of rack computer systems, such that operating temperatures in each portion of the additional computer space remain less than threshold operating temperatures associated with a respective portion of the additional computer space.

7. The method of claim 6, wherein:
the verifying the set of power system mechanical infrastructure comprises partitioning the additional computer space from the initial computer space, such that airflow between the initial computer space and the additional computer space is restricted and the heat generated in the additional computer space is restricted from heating the initial set of rack computer systems; and
the additional set of computer space mechanical infrastructure is operated in isolation from the set of initial computer space mechanical infrastructure, such that the additional set of power distribution infrastructure is restricted to receiving cooling support from the additional set of computer space mechanical infrastructure.

8. The method of claim 7, comprising:
subsequent to the verifying that the mechanical infrastructure in the data center is configured to provide cooling support to the additional set of rack computer systems in the additional computer space:
adjusting the additional set of computer space mechanical infrastructure to operate at a common operating state with the set of initial computer space mechanical infrastructure; and
subsequent to the adjusting the additional set of computer space mechanical infrastructure, removing airflow restrictions between the initial computer space and the additional computer space.

9. The method of claim 8, wherein:
the set of computer space mechanical infrastructure comprises a set of air handling units configured to induce a cooling air flow through a separate computer space;
the data center comprises an intake air header unit which is configured to supply intake air to each computer space, of the plurality of computer spaces, in parallel; and
partitioning the additional computer space from the initial computer space comprises partitioning an interior of the intake air header unit, so that intake air supplied to a particular set of air handling units, included in the initial set of computer space mechanical infrastructure, is isolated from being supplied to a separate set of air handling units included in the additional set of computer space mechanical infrastructure.

10. The method of claim 6, wherein:
the set of power system mechanical infrastructure in the data center is configured to remove at least a particular amount of heat from the data center; and
the method comprises, prior to verifying that the set of power system mechanical infrastructure in the data center is configured to provide cooling support to the additional set of rack computer systems:
determining that an additional set of power distribution infrastructure which is configured to supply a particular amount of electrical power is installed in the data center;
determining supplying the particular amount of electrical power is associated with generation of a particular amount of heat in the data center; and
installing the additional set of computer space mechanical infrastructure in the data center, based on a determination that the additional set of computer space mechanical infrastructure is configured to provide sufficient cooling support to cause the particular amount of heat to be removed from the data center.

11. The method of claim 1, wherein:
the set of computer space mechanical infrastructure comprises one or more of:

a set of direct evaporation air cooling units configured to induce cooling of an air flow;

a set of active air cooling units configured to induce cooling of an air flow via heat transfer with a circulating coolant;

a set of mechanical cooling units configured to induce cooling of an air flow via operation of a mechanical device; or a set of exhaust air moving devices configured to induce an exhaust airflow from a given space.

12. The method of claim 1, wherein:

the verifying that the set of computer space mechanical infrastructure is configured to provide cooling support to the set of rack computer systems comprises isolating an individual computer space from a remainder of computer spaces, of the plurality of computer spaces, prior to simulating electrical power consumption by a particular set of rack computer systems in the individual computer space, such that:

airflow between the individual computer space and the remainder of computer spaces is restricted concurrently with the simulating electrical power consumption by the particular set of rack computer systems; and the quantity of heat generated in the individual computer space is restricted from heating separate sets of rack computer systems located in the remainder of computer spaces.

13. The method of claim 12, wherein operating the set of computer space mechanical infrastructure comprises:

operating the set of computer space mechanical infrastructure in isolation from operation of separate sets of computer space mechanical infrastructure which remove heat from the separate sets of rack computer systems in the remainder of computer spaces, such that heat generated by the separate sets of rack computer systems is removed independently of operation of the set of computer space mechanical infrastructure.

14. The method of claim 13, comprising:

subsequent to verifying that the set of computer space mechanical infrastructure in the data center is configured to support cooling of the set of rack computer systems in the individual computer space:

adjusting the set of computer space mechanical infrastructure to operate at a common operating state with the separate sets of computer space mechanical infrastructure; and subsequent to the adjusting the set of computer space mechanical infrastructure, removing airflow restrictions between the individual computer space and the remainder of computer spaces.

15. The method of claim 12, wherein:

the set of computer space mechanical infrastructure in the data center comprises a set of air handling units configured to induce a cooling air flow through a separate computer space;

the data center comprises an intake air header unit which is configured to supply intake air to each computer space, of the plurality of computer spaces, in parallel; and isolating the individual computer space from the remainder of computer spaces comprises partitioning an interior of the intake air header unit, so that intake air supplied to a particular set of air handling units, included in the set of computer space mechanical infrastructure, is isolated from being supplied to a separate set of air handling units included in the separate sets of computer space mechanical infrastructure.

16. The method of claim 12, wherein the simulating electrical power consumption by the particular set of rack computer systems in the individual computer space comprises:

the set of power distribution infrastructure comprises a power busway which extends through the individual computer space and which is configured to be electrically coupled, at one end, to a power distribution system; and simulating electrical power consumption by the particular set of rack computer systems in the individual computer space comprises coupling the load bank located in the individual computer space to an opposite end of the power busway, such that the power busway supplies electrical power received from the power distribution system to the load bank located in the individual computer space via an entirety of the power busway.

17. The method of claim 16, wherein:

the power distribution system is configured to supply electrical power to the separate sets of computer systems, in the remainder of computer spaces, in parallel with the power busway extending through the individual computer space; and the method comprises, prior to verifying that the set of computer space mechanical infrastructure in the data center is configured to support cooling of the set of rack computer systems in the individual computer space, verifying that the set of computer space mechanical infrastructure in the data center is configured to support cooling of at least the power distribution system, wherein the method further comprises:

simulating electrical power consumption, by at least the particular set of rack computer systems and the separate sets of rack computer systems, of electrical power supplied by the power distribution system, such that the power distribution system generates another quantity of heat as a result of supporting the simulated electrical power consumption by at least the particular set of rack computer systems and the separate sets of rack computer systems; and operating the set of power system mechanical infrastructure, concurrently with the power distribution system supporting the simulated electrical power consumption by at least the particular set of rack computer systems and the separate sets of rack computer systems, such that the set of power system mechanical infrastructure removes the another quantity of heat from the power distribution system.

* * * * *